(12) United States Patent
Teramoto

(10) Patent No.: US 8,325,550 B2
(45) Date of Patent: Dec. 4, 2012

(54) SEMICONDUCTOR MEMORY DEVICE AND METHOD OF CONTROLLING AUTO-REFRESH

(75) Inventor: Kazuhiro Teramoto, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 297 days.

(21) Appl. No.: 12/656,178

(22) Filed: Jan. 20, 2010

(65) Prior Publication Data

US 2010/0182862 A1    Jul. 22, 2010

(30) Foreign Application Priority Data

Jan. 21, 2009   (JP) ................. P2009-011381

(51) Int. Cl.
*G11C 7/00*   (2006.01)
*G11C 7/04*   (2006.01)
(52) U.S. Cl. ................. 365/222; 365/211

(58) Field of Classification Search ........... 365/211, 365/222
See application file for complete search history.

(56) References Cited

U.S. PATENT DOCUMENTS

| 7,742,356 B2 | 6/2010 | Dono et al. |
| 2005/0169083 A1* | 8/2005 | Riho et al. ............ 365/222 |
| 2008/0181041 A1 | 7/2008 | Koshita |

FOREIGN PATENT DOCUMENTS

JP    2008-135113    6/2008

* cited by examiner

*Primary Examiner* — Ly D Pham
(74) *Attorney, Agent, or Firm* — McGinn IP Law Group, PLLC

(57) ABSTRACT

Auto-refresh of a semiconductor device may be controlled by setting the number of auto-refresh to be performed in a period of time, based on temperature, when an auto-refresh command is detected.

20 Claims, 9 Drawing Sheets

| TEMPERATURE RANGE | TLTEMPT | THTEMPT | M4KREF | M53KREF | M8KREF |
|---|---|---|---|---|---|
| TEMPERATURE<A | H | L | L | L | H |
| A≦TEMPERATURE<B | H | H | L | H | L |
| B≦TEMPERATURE | L | H | H | L | L |

SEMICONDUCTOR MEMORY DEVICE AND METHOD OF CONTROLLING AUTO-REFRESH

BACKGROUND OF THE INVENTION

1. Field of the Invention

The present invention relates to a semiconductor memory device and a method of controlling auto-refresh of the semiconductor device. More specifically, the present invention relates to a semiconductor memory device that refreshes a memory cell corresponding to an address generated by an internal address counter upon input of a predetermined command.

Priority is claimed on Japanese Patent Application No. 2009-011381, filed Jan. 21, 2009, the content of which is incorporated herein by reference.

2. Description of the Related Art

A dynamic random access memory (DRAM) is a semiconductor memory device having a unit memory cell of a selection transistor and a data storage capacitor, selecting a specific memory cell out of plural memory cells by the use of a row/column address, and reading and writing data from and to the selected memory cell. However, the capacitor as a storage node is volatile and it is thus necessary to rewrite (refresh) data at a predetermined interval. In the specifications thereof, the number of refresh operations and the maximum refresh interval are determined. Japanese Unexamined Patent Application, First Publication, No. JP-A-2008-135113 discloses the followings. The refresh modes are classified into an auto-refresh (AREF) mode and a self refresh mode. The AREF is a mode in which a memory cell corresponding to an address generated by an internal address counter is performed in a tRFC period (a period from an AREF command to an ACT/AREF command) when the AREF command is input. After the refresh operation, the address counter is updated and is provided for the next AREF command.

The self refresh is a mode in which a refresh operation is performed every time at a frequency determined by an internal oscillation circuit (oscillator) while a CKE signal is in the "L" level, when the CKE (Clock Enable) signal is set to the "L" level at the same time as an REF command. In the self refresh mode, it is possible to adjust the trade-off relation between the current consumption and the data retention time by adjusting the period of the internal oscillator. Control methods of giving temperature dependency to the refresh period, changing the period using a temperature sensor, and the like have been performed as a method of reducing the current consumption in the self refresh mode. However, in the self refresh mode, since the CKE signal is in the "L" level, an external clock signal is not input to the DRAM. Accordingly, after it exits from the self refresh mode, there is a problem in that a long period of time is necessary for re-locking a synchronization circuit such as a DLL (Delay Lock Loop) and data cannot be read just after it exits from the self refresh mode.

On the other hand, in the AREF mode, data can be read just after the tRFC. Accordingly, the AREF mode has been often used when the system frequently operates. The AREF mode generally employs an 8K-refresh (8KREF) mode in the recent DRAM specification. The 8K-refresh mode is a mode in which an address is returned to an initial address after an AREF command is repeated 8192 times. However, when the data retention time is shortened for reasons of variation in the characteristics of a semiconductor device and the like, data may disappear even when it is intended to refresh the initial address after the 8192 times.

SUMMARY

In one embodiment, a semiconductor device may include, but is not limited to, an auto-refresh command detector that detects an auto-refresh command, and a refresh number setting unit that sets the number of auto-refresh to be performed in a period of time, based on temperature, when the auto-refresh command detector detects the auto-refresh command.

In another embodiment, a device may include, but is not limited to, a memory array including a plurality of sets, each of the plurality of sets including a plurality of memory elements, and a control circuit performing a first refresh operation on a first number of sets in the plurality of sets in response to a first refresh command, the number of the first number of sets being dependent on a variation in temperature of the device.

In still another embodiment, a method of controlling auto-refresh of a semiconductor device may include, but is not limited to, setting the number of auto-refresh to be performed in a period of time, based on temperature, every time an auto-refresh command is detected.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
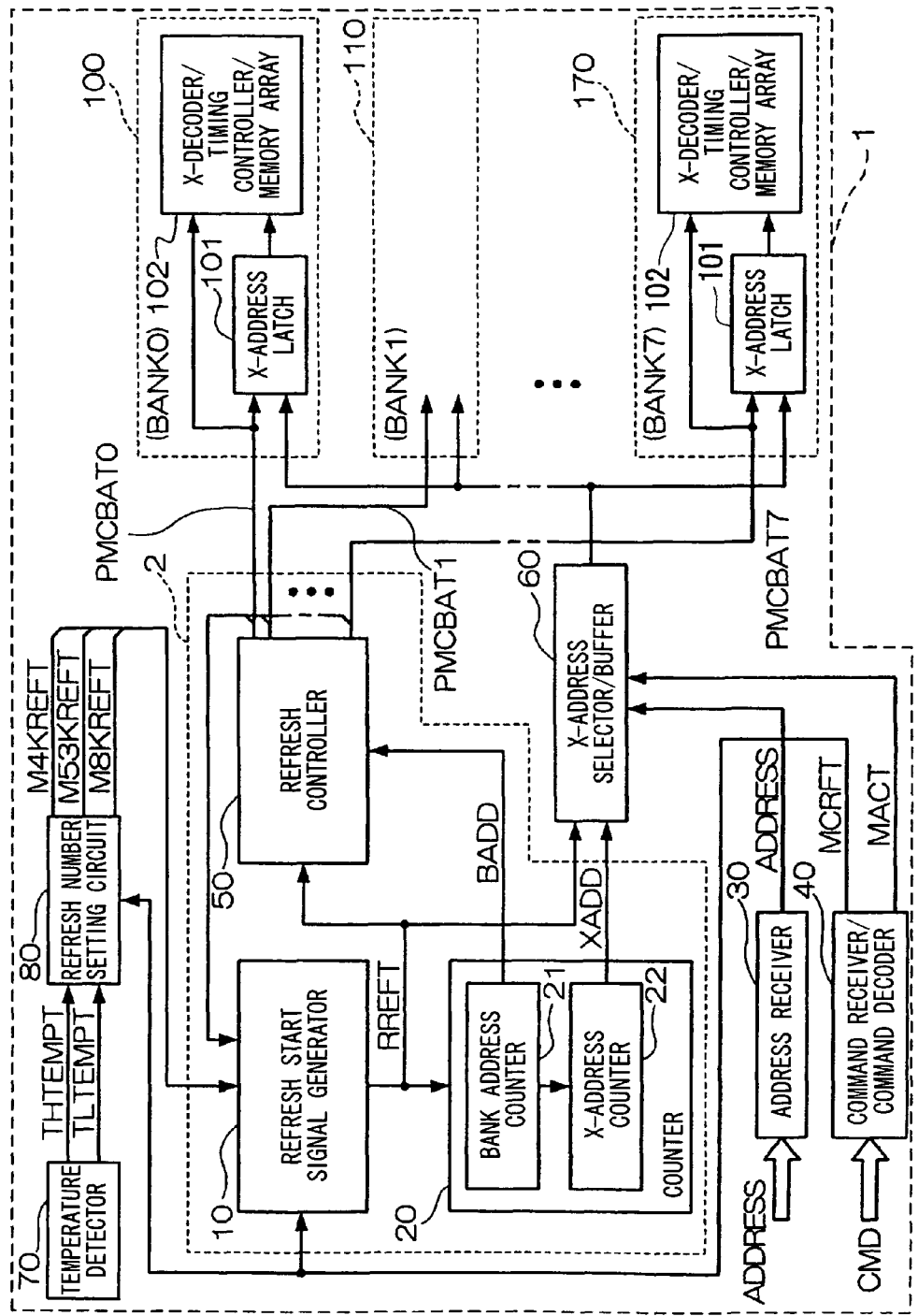
FIG. 1 is a block diagram illustrating a semiconductor memory device in accordance with one embodiment of the present invention.

Before describing the present invention, the related art will be explained in detail, in order to facilitate the understanding of the present invention.

Data retention time depends on temperature. In general, data retention time is likely to become shorter as temperature increases. Shorter data retention time needs more frequent refresh operations. It is difficult to shorten the time interval between AREF commands on an external system. Thus, 5.3K-refresh method (5.3KREF method) and 4K-refresh method (4KREF) can be adopted to avoid data loss. 5.3K-refresh method is to refresh 1.5 times in the period of time tRFC. 4K-refresh method is to refresh 2 times in the period of time tRFC. Increase in the number of refresh operations in the period of time tRFC will increase the operating current IDD5 (AREF current). If the frequent refresh method such as the 5.3K-refresh method and the 4K-refresh method is once adopted, it is difficult to reduce the current. Generally, advanced systems need to reduce the consumption of power as much as possible. DRAMs also need to reduce the consumption of power as much as possible. Under these requirements, it is difficult to adopt the 5.3K-refresh method (5.3KREF method) or the 4K-refresh method (4KREF).

The refresh timings are not adjustable or controllable depending upon temperature as long as the refresh is performed in accordance with the auto-refresh command (AREF) as the external command. The auto-refresh command (AREF) is given by an external controller which is outside the DRAM chip. This method is different from self-refresh methods using refresh commands generated inside the DRAM chip. The auto-refresh method is adopted for each DRAM chip by previously setting the 5.3K-refresh method (5.3KREF method) or the 4K-refresh method (4KREF). In some circumstances in use, the refresh timings are so long as to allow data loss. In some circumstances in use, the refresh timings are so short as to increase the consumption of current.

The invention will be now described herein with reference to illustrative embodiments. Those skilled in the art will recognize that many alternative embodiments can be accomplished using the teaching of the present invention and that the invention is not limited to the embodiments illustrated for explanatory purpose.

In one embodiment, a semiconductor device may include, but is not limited to, an auto-refresh command detector that detects an auto-refresh command, and a refresh number setting unit that sets the number of auto-refresh to be performed in a period of time, based on temperature, when the auto-refresh command detector detects the auto-refresh command.

The semiconductor device may further include, but is not limited to, a temperature detector that detects a temperature of the semiconductor device. The refresh number setting unit sets the number of refresh based on the temperature detected by the temperature detector.

The semiconductor device may further include, but is not limited to, a command decoder that decodes an external command. The command decoder outputs a refresh execution signal if the decoded command is to select auto-refresh. The semiconductor device may further include, but is not limited to, a refresh start signal generator that outputs a predetermined number of refresh start signal based on the refresh execution signal and the detected temperature.

The semiconductor device may further include, but is not limited to, a plurality of memory banks, a temperature detector that detects a temperature of the semiconductor device, and a bank address counter that counts a bank address up to an upper limit based on the refresh execution signal. The upper limit is determined based on the detected temperature. The bank address specifies a memory bank in the plurality of memory banks. The bank address counter carries a counting number at a division number. The division number is the number of time-division by which refresh is performed to the plurality of memory banks.

The semiconductor device may further include, but is not limited to, an address counter that counts up an address when carrying the counting number. The address selects a word line of the plurality of memory banks.

The temperature detector detects the temperature by using a plurality of power units having different temperature characteristics.

The refresh number setting unit supplies a signal to the refresh start signal generator. The signal designates the number of outputs of the refresh start signal. The refresh number setting unit supplies the signal, based on the temperature detected by the temperature detector, every time of inputting the refresh execution signal. The refresh number setting unit supplies the signal while retaining the signal.

The semiconductor device may further include, but is not limited to, a refresh controller that controls refresh operations of a selected memory bank of the plurality of memory banks. The selected memory bank is selected by the back address supplied from the bank address counter. The refresh controller controls the refresh operations in response to an input of the refresh start signal. The semiconductor device may further include, but is not limited to, an address selector that selects an address supplied from the address counter, in response to the input of the refresh start signal. The address selector supplies the address to the plurality of bank addresses.

In another embodiment, a device may include, but is not limited to, a memory array including a plurality of sets, each of the plurality of sets including a plurality of memory elements; and a control circuit performing a first refresh operation on a first number of sets in the plurality of sets in response to a first refresh command. The number of the first number of sets is dependent on a variation in temperature of the device.

In some cases, the device may further include, but is not limited to, a temperature detector circuit detecting the temperature of the device and supplying a result of the detecting to the control circuit.

In some cases, the control circuit may include, but is not limited to, a decoder portion; a signal generating portion; and a control portion. The decoder portion receives the first refresh command and supplies a refresh execution signal to the generating portion in response to the receiving of the first refresh command. The signal generating portion receives the result of the detecting from the temperature detector and the refresh execution signal from the decoder portion. The signal generating portion supplies a refresh start signal to the control portion such that the control portion performs the first refresh operation on the first number of sets comprising the sets of memory elements.

In some cases, the first refresh command may be supplied externally to the device.

In some cases, the control circuit may generate a plurality of internal refresh commands in response to a second refresh command at a first cycle time therein and performs a plurality of second refresh operations in response to the internal refresh commands. The control circuit may perform each of the second refresh operations on an associated second number of sets in the plurality of sets memory elements.

In some cases, the number of the associated second number of sets may be free from the variation in temperature of the device.

In some cases, the device may further include, but is not limited to, a temperature detector circuit detecting the temperature of the device and supplying a result of the detecting to the control circuit. The control circuit, when the control circuit receives the first refresh command, may adjust the number of the first number of sets based on the result of detecting, and the control circuit, when the control circuit receives the second refresh command, may adjust the first cycle time based on the result of detecting without adjusting the number of the associated second number of sets.

In some cases, the first refresh command may be an auto-refresh command and the second refresh command is a self refresh command.

In some cases, the number of sets including the part of the sets of the memory elements may increase in response to rising of the temperature of the device and may decrease in response to declining of the temperature.

In some cases, the control circuit varies the number of sets including nonlinearly the part of the sets of the memory elements.

In still another embodiment, a method of controlling auto-refresh of a semiconductor device may include, but is not limited to, setting the number of auto-refresh operations to be performed in a period of time, based on temperature, when an auto-refresh command is detected. The method may further include, but is not limited to, detecting a temperature of a semiconductor device. The method may further include, but is not limited to, counting a bank address up to an upper limit based on a refresh execution signal. The upper limit is determined based on the detected temperature. The bank address specifies a memory bank in a plurality of memory banks. The method may further include, but is not limited to, carrying a counting number at a division number, the division number being the number of time-division by which refresh is performed to the plurality of memory banks. The method may further include, but is not limited to, counting up an address when carrying the counting number, the address selecting a word line of the plurality of memory banks.

Hereinafter, embodiments of the invention will be described with reference to the accompanying drawings. FIG. 1 is a block diagram schematically illustrating the configuration of a semiconductor memory device 1 constituting a monolithic DRAM. The semiconductor memory device 1 shown in FIG. 1 includes memory elements divided into plural memory banks in a part of a semiconductor device and serves to select one of an auto-refresh mode and a self refresh mode and to refresh the memory elements. Here, whenever a command for selecting the auto-refresh mode is detected, the number of refresh operations to be performed is selected depending on the temperature of the semiconductor device. Since the invention relates to a refresh process when the auto-refresh mode is selected, only signals relating to the refresh process in the auto-refresh mode and control thereof will be described herein.

As shown in FIG. 1, the semiconductor memory device 1 performing a refresh operation includes a refresh controller 2, an address receiver 30, a command receiver/decoder 40, an X address selector/buffer circuit 60, a temperature detector circuit 70, a refresh number setting circuit 80, and eight memory banks from memory bank 0 (100) to memory bank 7 (170). The refresh controller 2 includes a refresh start signal generator circuit 10, a counter circuit 20, and a refresh operation control circuit 50. The eight memory banks of memory bank 0 (100) to memory bank 7 (170) each include an X address latch 101 and an X decoder timing control memory array 102 including a memory array having DRAM memory cells.

In the above-mentioned configuration, when an address signal ADDRESS is input, for example, from an external DRAM controller, the address receiver 30 stores and outputs the input address ADDRESS in synchronization with a predetermined clock signal.

When a command CMD is input from the external DRAM controller, the command receiver/decoder 40 decodes the input command CMD. When the decoded command CMD is an auto-refresh command, the command receiver/decoder 40 generates a refresh signal MCRFT and outputs the generate refresh signal to the refresh start signal generator circuit 10 and the refresh number setting circuit 80. When the decoded command CMD is an ACT command indicating a word line activating command, the command receiver/decoder 40 generates an MACT signal and outputs the generated MACT signal to the X address selector/buffer circuit 60. The MACT signal is a signal for selecting the address ADDRESS input from the outside via the address receiver 30 as an X address (that is, a row address or a word address) for specifying a word line to be activated in the memory array in the memory banks 0 (100) to 7 (170) by the use of the X address selector/buffer circuit 60 when the ACT command is input.

In this embodiment, the refresh signal MCRFT and the MACT signal output from the command receiver/decoder 40 each are a pulse signal (in the "H" level or the "L" level) with a predetermined pulse width.

The refresh start signal generator circuit 10 outputs a refresh start signal RREFT by a predetermined number of times on the basis of the temperature detection result of the temperature detector circuit 70 in response to the refresh signal MCRFT. The refresh signal MCRFT is input to the refresh start signal generator circuit 10 from the command receiver/decoder 40. An M4KREFT signal, an M53KREFT signal, and an M8KREFT signal output from the refresh number setting circuit 80 are input to the refresh start signal generator circuit 10. The refresh start signal generator circuit 10 generates the refresh start signal RREFT at a predetermined interval and by a predetermined number of times on the basis of the input signals, and outputs the generated refresh start signal to the counter circuit 20, the refresh operation control circuit 50, and the X address selector/buffer circuit 60. Here, the M4KREFT signal, the M53KREFT signal, and the M8KREFT signal are signals indicating one of three types of refresh modes with different numbers of refresh operations (that is, with different refresh periods), and are generated by the refresh number setting circuit 80 on the basis of the temperature detection result of the temperature detector circuit 70.

Only one of the M4KREFT signal, the M53KREFT signal, and the M8KREFT signal is in the "H" level. In this embodiment, when the M4KREFT signal is in the "H" level, a 4KREF mode (4K-refresh mode) in which the refresh operation is performed repeatedly 2 times during the tRFC period is selected. When the M53KREFT signal is in the "H" level, a 5.3KREF mode (5.3K-refresh mode) in the refresh operation is performed repeatedly 1.5 times during the tRFC period is selected. When the M8KREFT signal is in the "H" level, a 8KREF mode (8K-refresh mode) in the refresh operation is performed repeatedly 1 time during the tRFC period is selected. Although the details will be described later, in this embodiment, the refresh start signal RREFT is generated from the refresh start signal generator circuit 10 by 8 times, 6 times, and 4 times in response to the input of the refresh signal MCRFT, when the M4KREFT signal, the M53KREFT signal, and the M8KREFT signal are in the "H" level, respectively.

The counter circuit 20 includes a bank address counter 21 and an X address counter 22. The bank address counter 21 counts up a bank address BADD which is an address for specifying a memory bank, whenever the refresh start signal RREFT is input. The X address counter 22 counts up an X address XADD for specifying a word line to be activated in response to the carry output of the bank address counter 21. That is, in the counter circuit 20, when the highest bit of the bank address BADD of the bank address counter 21 is counted up, that is, when the bank address BADD is carried, the X address XADD of the X address counter 22 is counted up. The bank address counter 21 outputs the bank address BADD to the refresh operation control circuit 50. The X address counter 22 outputs the X address XADD to the X address selector/buffer circuit 60. A specific memory bank is selected out of the plural memory banks 0 (100) to 7 (170) by the bank address BADD. As described above, the refresh start signal RREFT is generated by the refresh start signal generator circuit 10 by the number of times determined depending on the temperature detected by the temperature detector circuit 70. Accordingly, the bank address counter 21 counts the refresh start signal RREFT whenever the refresh signal MCRFT is generated, up to the number of times determined depending on the temperature. The bank address counter 21 carries the count number at a division number. The division number is the number of time-division by which the refresh process is performed to the plurality of memory banks 0 (100) to 7 (170) as described later.

The bank address counter 21 has a division number therein by which the refresh process is performed on the plural memory banks in a time divisional manner (or at a time interval), and performs the carry process at the set division number of the plural memory banks. In this embodiment, the eight memory banks 0 (100) to 7 (170) are divided into four set of two memory banks, that is, the division number of memory banks is set to "4", and the refresh process is performed on two memory banks at a time. Accordingly, the bank memory counter 21 repeatedly counts the bank address BADD of two bits from "0" to "3". In this case, the bank address "0" is counted after "3" and then the bank address is counted up again.

The X address counter 22 has a word number of each memory bank as a refresh control target, counts the X address XADD up to the set word number of each memory bank, returns the value of the X address XADD to "0" at the set word number of each memory bank, and then counts up the X address XADD.

The counters of the counter circuit 20, that is, the bank address counter 21 and the X address counter 22, retain the count value even after the refresh process is once performed. Accordingly, the counter circuit 20 sequentially counts up the retained values of the bank address BADD and the X address XADD whenever an auto-refresh command REF is input from the external DRAM controller. As a result, the refresh process can be performed on the entire word lines of the memory banks.

When the refresh start signal RREFT is input from the refresh start signal generator circuit 10, the refresh operation control circuit 50 controls the refresh operation on the memory banks (from the memory bank 0 (100) to the memory bank 7 (170)) by outputting a refresh control signal PMCBATi (where i is an integer of 9 to 7) corresponding to the memory bank selected by the bank address BADD input from the bank address counter 21 for a predetermined period of time. That is, the refresh operation control circuit 50 outputs a refresh control signal PMCBAT0 for controlling the refresh operation on the memory bank 0 (100), a refresh control signal PMCBAT1 for controlling the refresh operation on the memory bank 1 (110), . . . , and a refresh control signal PMCBAT7 for controlling the refresh operation on the memory bank 7 (170). The outputs of the refresh control signals PMCBATi are input to the corresponding memory banks i.

In this embodiment, as described above, the refresh operation control circuit 50 divides the eight memory banks 0 (100) to 7 (170) into four sets each including two memory banks, and performs the refresh process on two memory banks at a time. At this time, the refresh process on the four sets of memory banks is temporally discretely performed in a time divisional manner. In a specific combination, the refresh operation control circuit 50 outputs the refresh control signal PMCBAT0 to the memory bank 0 (100) and the refresh control signal PMCBAT7 to the memory bank 7 (170) at the same time. Similarly, the refresh operation control circuit 50 outputs the refresh control signal PMCBAT4 to the memory bank 4 and the refresh control signal PMCBAT3 to the memory bank 3 at the same time. Similarly, the refresh operation control circuit 50 outputs the refresh control signal PMCBAT1 to the memory bank 1 (110) and the refresh control signal PMCBAT6 to the memory bank 6 at the same time. The refresh operation control circuit 50 outputs the refresh control signal PMCBAT5 to the memory bank 5 and the refresh control signal PMCBAT2 to the memory bank 2 at the same time.

The method of generating the refresh control signal PMCBATi from the refresh operation control circuit 50 is not limited to the above-mentioned method. For example, by causing each memory bank to generate a refresh process end signal, the generation period of time for the refresh control signal PMCBATi may be controlled on the basis of the end signal.

In response to the input of the refresh start signal RREFT, the X address selector/buffer circuit 60 selects the X address XADD input from the X address counter 22 and outputs the selected X address XADD to the X address latches (110 and the like) in the memory banks 0 (100) to 7 (170). That is, when the refresh start signal RREFT is input from the refresh start signal generator circuit 10, the X address selector/buffer circuit 60 takes and retains the X address XADD output from the X address counter 22 in response to the input. The refresh start signal RREFT is a signal generated when the command CMD from the external DRAM controller is an auto refresh command as described above. When the refresh start signal RREFT is input, the X address selector/buffer circuit 60 selects the retained X address XADD and outputs the selected X address XADD to the memory banks. When the MACT signal is input from the command receiver/decoder 40, the X address selector/buffer circuit 60 selects an external address ADDRESS input via the address receiver 30 and outputs the selected external address ADDRESS to the memory banks. The MACT signal is a signal generated when the command CMD from the external DRAM controller is the ACT command as described above.

In this embodiment, the refresh start signal RREFT and the MACT signal input to the X address selector/buffer circuit 60 are signals output in a pulse shape for a predetermined period of time. Accordingly, in response to the input of the refresh start signal RREFT and the MACT signal, the X address selector/buffer circuit 60 outputs the X address XADD or the external address ADDRESS to the memory banks and retains the output X address XADD or the output external address ADDRESS until the next refresh start signal RREFT or the MACT signal is input.

The temperature detector circuit 70 is a circuit detecting the temperature of the semiconductor device using plural power source circuits having different temperature characteristics and formed in a part of the semiconductor device constituting the semiconductor memory device 1. The power source circuit forms a power unit. The temperature detector circuit 70 outputs plural signals having different output levels for plural different temperatures. In this embodiment, the temperature detector circuit 70 outputs a signal THTEMPT which is in the "H" level at a temperature equal to or higher than a predetermined temperature (temperature A) and a signal TLTEMPT which is in the "H" level at a temperature less than a predetermined temperature (temperature B, where A<temperature<B).

The refresh setting circuit 80 outputs signals indicating the number of output refresh start signals RREFT to the refresh start signal generator circuit 10 on the basis of the outputs THTEMPT and TLTEMPT of the temperature detector circuit 70. The M4KREFT signal, the M53KREFT signal, and the M8KREFT signal which are the signals indicating the number of output refresh start signals RREFT are signals of which the output states are retained whenever the refresh signal MCRFT is input.

The memory bank 0 (100) to the memory bank 7 (170) each have a circuit group having a function. Here, only the circuit group related to the refresh operation in the memory banks will be described.

The memory bank 0 (100) includes an X address latch circuit 101 for the memory bank 0 and an X decoder timing control memory array 102. The X decoder timing control memory array 102 includes an X decoder circuit, a timing control circuit, and a memory cell array.

The X address latch circuit 101 latches and outputs the address output from the X address selector/buffer circuit 60 in response to the input of the PMCBAT0 signal from the refresh operation control circuit 50. In response to the input of the refresh control signal PMCBAT0 from the refresh operation control circuit 50, the X decoder timing control memory array 102 performs the refresh operation on the memory cell in the word line specified by the address output from the X address latch circuit 101. The block 1 (110) to the block 7 (170) are circuits for the memory bank 1 to the memory bank 7, respectively, and each has the same configuration and function as the memory bank 0 (100).

The configuration of the temperature detector circuit 70 shown in FIG. 1 will be described with reference to FIG. 2. The temperature detector circuit 70 shown in FIG. 2 includes a band-gap reference voltage circuit 71, a voltage follower circuit 707, and a voltage comparison circuit 72.

The band-gap reference voltage circuit 71 includes an operational amplifier 701, a resistor 702, a resistor 703, a transistor 704, a resistor 705, and a transistor 706. In this case, the resistor 702 and the resistor 705 have the same resistance value of R2 and the resistor 703 has a resistance value R1 different from R2. The transistor 704 is represented by Q1 and the transistor 706 is represented by Q2. The output voltage of the operational amplifier 701 is a reference voltage VBGR not depending on the temperature. The ends of the resistor 702 and the resistor 705 are connected to the output of the operational amplifier 701. The other end of the resistor 702 is connected to an end of the resistor 703 and the connection node is connected to the non-inverting input of the operational amplifier 701. The other end of the resistor 703 is connected to the emitter of the transistor 704 which is a parasitic PNP transistor of the P-type substrate. On the other hand, the other end of the resistor 705 is connected to the emitter of the transistor 706 which is the parasitic PNP transistor of the P-type substrate and the connection node is connected to the inverting input of the operational amplifier 701.

The voltage follower circuit 707 connects its output to the inverting input terminal using an operational amplifier and thus outputs the same voltage VF as the voltage VBGR input to the non-inverting input terminal.

The voltage comparison circuit 72 includes a resistor 708, a resistor 709, a resistor 710, a comparator 711, and a comparator 712. The resistor 708, the resistor 709, and the resistor 710 are connected in series in this order and an end of the resistor 708 is connected to the output of the voltage follower circuit 707 and the other end thereof is connected to the resistor 709 and the non-inverting input of the comparator 711. The other end of the resistor 709 is connected to the resistor 710 and the inverting input of the comparator 712. The other end of the resistor 710 is connected to the ground (the substrate potential VSS). The inverting input of the comparator 711 and the non-inverting input of the comparator 712 are connected to the connection node of the resistor 705 and the transistor 706 in the band-gap reference voltage circuit 71.

In this case, the connection node of the resistor 708 and the resistor 709 has a voltage of V1 and the connection node of the resistor 709 and the resistor 710 has a voltage of V2. The voltage of the connection node of the resistor 705 and the emitter of the transistor 706 is represented by VBE(Q2). The output of the comparator 711 is represented by THTEMPT and the output of the comparator 712 is represented by TLTEMPT.

Figure 2:
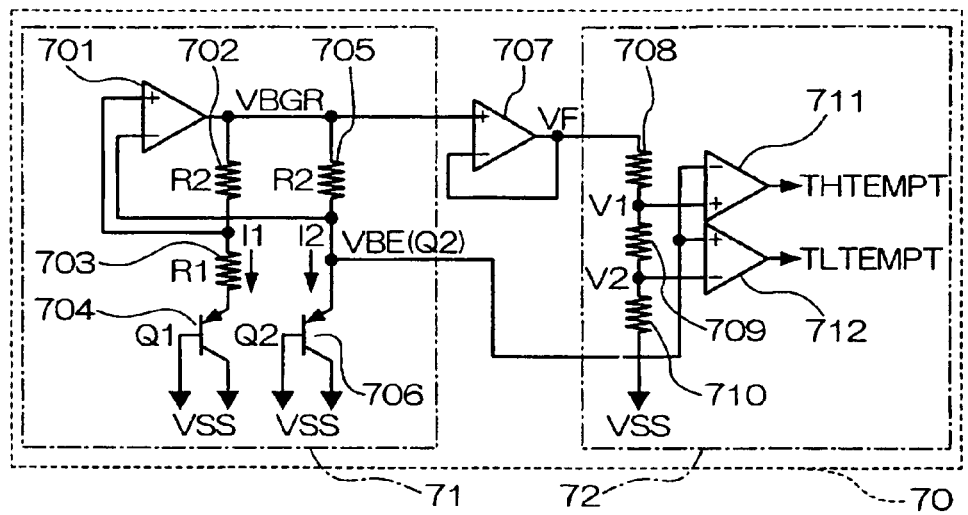
FIG. 2 is a circuit diagram illustrating the configuration of a temperature detecting circuit included in the semiconductor memory device of FIG. 1.

The temperature detector circuit 70 shown in FIG. 2 constitutes a semiconductor temperature sensor detecting a temperature using a semiconductor device formed on the same substrate as the semiconductor substrate having the memory device formed thereon. In this example, the semiconductor temperature sensor uses the fact that the voltage of the PN junction of semiconductor varies depending on the temperature. More specifically, in this example, the forward voltage drop VBE (about −2 mV/° C.) between the base and the emitter of the transistor is used. In this case, the temperature detector circuit 70 forms a circuit detecting the temperature using two (plural) power source circuits (power units) with different temperature characteristics of the band-gap reference voltage circuit 71 (first power source unit), which is formed in a part of the semiconductor device), not depending on the temperature and a power source circuit (second power source unit), which includes the resistor 705 and the transistor 706 in the band-gap reference voltage circuit 71, depending on the temperature.

The output voltage VBGR of the band-gap reference voltage circuit 71 makes a characteristic of a positive temperature coefficient using the difference between currents I1 and I2 flowing in two bipolar transistors Q1 and Q2 having the same emitter size, and cancels the negative temperature coefficient of the base-emitter voltage VBE, thereby forming a potential not depending on the temperature. Potentials V1 and V2 obtained by dividing the source potential VF hardly depending on the temperature, which is formed by the voltage follower circuit 707 on the basis of the VBGR, by resistance are compared with the VBE(Q2) having the negative temperature coefficient, thereby detecting the temperature.

Figure 3:
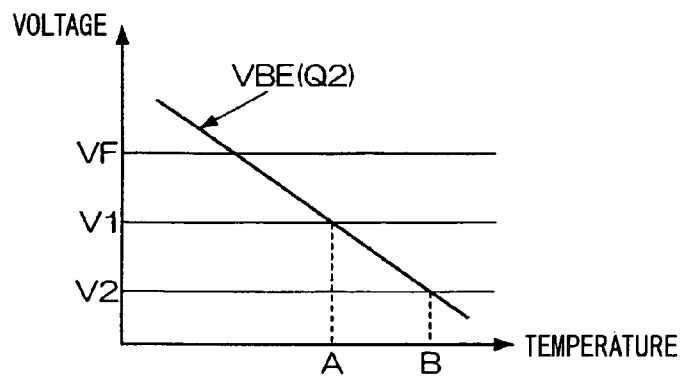
FIG. 3 is a diagram illustrating temperature-voltage characteristic of the temperature detecting circuit of FIG. 2.

That is, VBE(Q2)>V1, V2 is satisfied when the initial temperature is low as shown in FIG. 3, but the potential of VBE(Q2) is lowered with the rising in temperature, V1>VBE (Q2)>V2 is satisfied when the temperature is higher than the temperature A. When the temperature is higher than the temperature B, V1>V2>VBE(Q2) is satisfied. Accordingly, by comparing V1 and V2 with the potential of VBE, it is possible to detect whether the temperature is higher than the set temperature. The resistance value of the voltage VF dividing resistor can be adjusted so that the output potential is higher than VBE(Q2) at a desired temperature.

Figure 4:
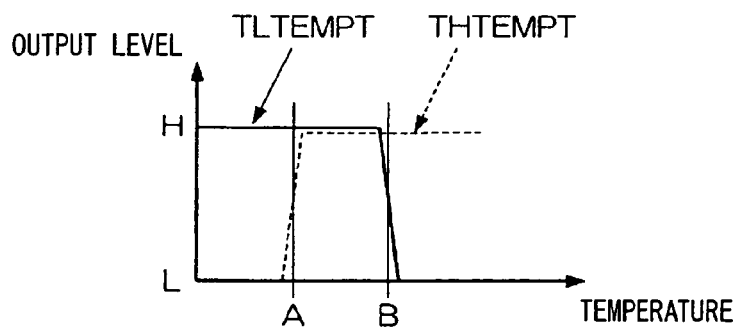
FIG. 4 is a diagram illustrating temperature-output characteristic of the temperature detecting circuit of FIG. 2.

In the voltage comparison circuit 72 shown in FIG. 2, for example, as shown in FIG. 4, the signal THTEMPT is set to the "H" level when the temperature is equal to or higher than a temperature A and the signal TLTEMPT is set to the "L" level when the temperature is equal to or higher than a temperature B (A<B). That is, THTEMPT="L" and TLTEMPT="H" are set when the temperature of the semiconductor device is lower than A, THTEMPT="H" and TLTEMPT="H" are set when the temperature of the semiconductor device is equal to or higher than A and lower than B, and THTEMPT="H" and TLTEMPT="L" are set when the temperature of the semiconductor device is equal to or higher than B.

The configuration of the refresh number setting circuit 80 shown in FIG. 1 will be described with reference to FIG. 5. The refresh number setting circuit 80 shown in FIG. 5 outputs the M4KREFT signal, the M53KREFT signal, and the M8KREFT signal which are the signals indicating the number of output refresh start signals RREFT while retaining the output state every input of the refresh signal MCRFT on the basis of the outputs of THTEMPT and TLTEMPT of the temperature detector circuit 70. Here, the block 81 is a circuit block outputting the M4KREFT signal, the M53KREFT signal, and the M8KREFT signal which are the signals indicating the number of output refresh start signals RREFT while retaining the output state every input of the refresh signal MCRFT. On the other hand, the block 82 is a circuit block setting the M4KREFT signal, the M53KREFT signal, and the M8KREFT signal regardless of the outputs THTEMPT and TLTEMPT of the temperature detector circuit 70 in a test mode or the like.

The block 81 includes an AND gate 803 having the output M4KREF of a two-OR-AND complex gate 801 as a positive logical input and the output M8KREF of a two-OR-AND complex gate 802 as a negative logical input, an exclusive OR gate 804 (hereinafter, referred to as "EXOR gate 804") having the output M4KREF and M8KREF as two inputs and having a negative logical output, and an AND gate 805 having the output M4KREF as a negative logical input and the output M8KREF as a positive logical input. The block 81 includes three D flip-flops 806, 807, and 808. The three D flip-flops 806, 807, and 808 have the outputs of the AND gate 803, the EXOR gate 804, and the AND 805 as their inputs, respectively, and uses the refresh signal MCRFT as a clock signal.

When the refresh signal MCRFT is in the "H" level, the D flip-flop 806 receives the output of the AND gate 803, retains the value received while the refresh signal MCRFT is in the "L" level, and outputs the retained value as the signal M4KREFT. When the refresh signal MCRFT is in the "H" level, the D flip-flop 807 receives the output of the EXOR GATE 804, retains the value received while the refresh signal MCRFT is in the "L" level, and outputs the retained value as the signal M53KREFT. When the refresh signal MCRFT is in the "H" level, the D flip-flop 808 receives the output of the AND gate 805, retains the value received while the refresh signal MCRFT is in the "L" level, and outputs the retained value as the signal M8KREFT.

The block 82 includes an inverter 809, a transistor 810, a transistor 811, a fuse 812, an inverter 813, an OR gate 814, a transistor 815, a transistor 816, a fuse 817, an inverter 818, an OR gate 819, and a DFT (Design For Test) decoder 820. In this case, a signal PON which is in the "H" level at the time of turning on the semiconductor memory device 1 is input to the inverter 809 and the output of the inverter 809 is connected to the gates of the transistors 810 and 815. The sources of the transistors 810 and 815 are connected to the power source and the drains thereof are connected to the fuses 812 and 817, respectively. The drains of the transistors 810 and 815 are connected to the inputs of the inverters 813 and 818. The drains of the transistors 811 and 816 are connected to the inputs of the inverters 813 and 818, respectively, and the outputs thereof are connected to the gates of the transistors 811 and 816. The inverter 813 and the transistor 811 constitute a latch circuit receiving a voltage corresponding to the state of the fuse 812 when the signal PON in the "H" level is input, and the inverter 818 and the transistor 816 constitute another latch circuit receiving a voltage corresponding to the state of the fuse 817 when the signal PON in the "H" level is input.

The negative logical input of the OR gate 814 is connected to the output of the inverter 813 and the positive logical input thereof is connected to one output of the DFT decoder 820. The output of the OR gate 814 is connected to the OR input of the complex gate 801 and the negative logical AND input of the complex gate 802. The negative logical input of the OR gate 819 is connected to the output of the inverter 818 and the positive logical input is connected to one output of the DFT decoder 820. The output of the OR gate 819 is connected to the OR input of the complex gate 802 and the negative logical AND input of the complex gate 801.

The external address signal ADDRESS and a signal TMRST for setting the operation state in the test mode are input to the DFT decoder 820.

In this configuration, the block 82 invalidates the outputs THTEMPT and TLTEMPT of the temperature detector circuit 70 by cutting off the fuse 812 and the fuse 815, thereby fixing the operation mode of the refresh. The DFT decoder 820 invalidates the outputs THTEMPT and TLTEMPT of the temperature detector circuit 70 in the test mode and fixes the refresh operation mode to a desired state depending on the value of the external address signal ADDRESS.

The block 82 is a circuit invalidating the output of the temperature detector circuit 70 and is not directly associated with the features of the invention, whereby the block 82 may be omitted. In the following description, it is assumed that the outputs of the OR gate 814 and the OR gate 819 are always in the "L" level, the signal THTEMPT is always equal to the signal M4KREF, and the signal TLTEMPT is always equal to the signal M8KREF.

In the block 81, the output signals THTEMPT and TLTEMPT (accurately, the signal M4KREF and the signal M8KREF equal thereto) of the temperature detector circuit 70 are decoded by the AND gate 803, the EXOR gate 804, and the AND gate 805. The output of the AND gate 803 is in the "H" level when THTEMPT="L" and TLTEMPT="H", and the output is in the "L" level otherwise. The output of the EXOR gate 804 is in the "H" level when THTEMPT="H" and TLTEMPT="H", and the output is in the "L" level otherwise. The output of the AND gate 805 is in the "H" level when THTEMPT="H" and TLTEMPT="L" and the output is in the "L" level otherwise. This is shown in FIG. 6.

Figure 5:
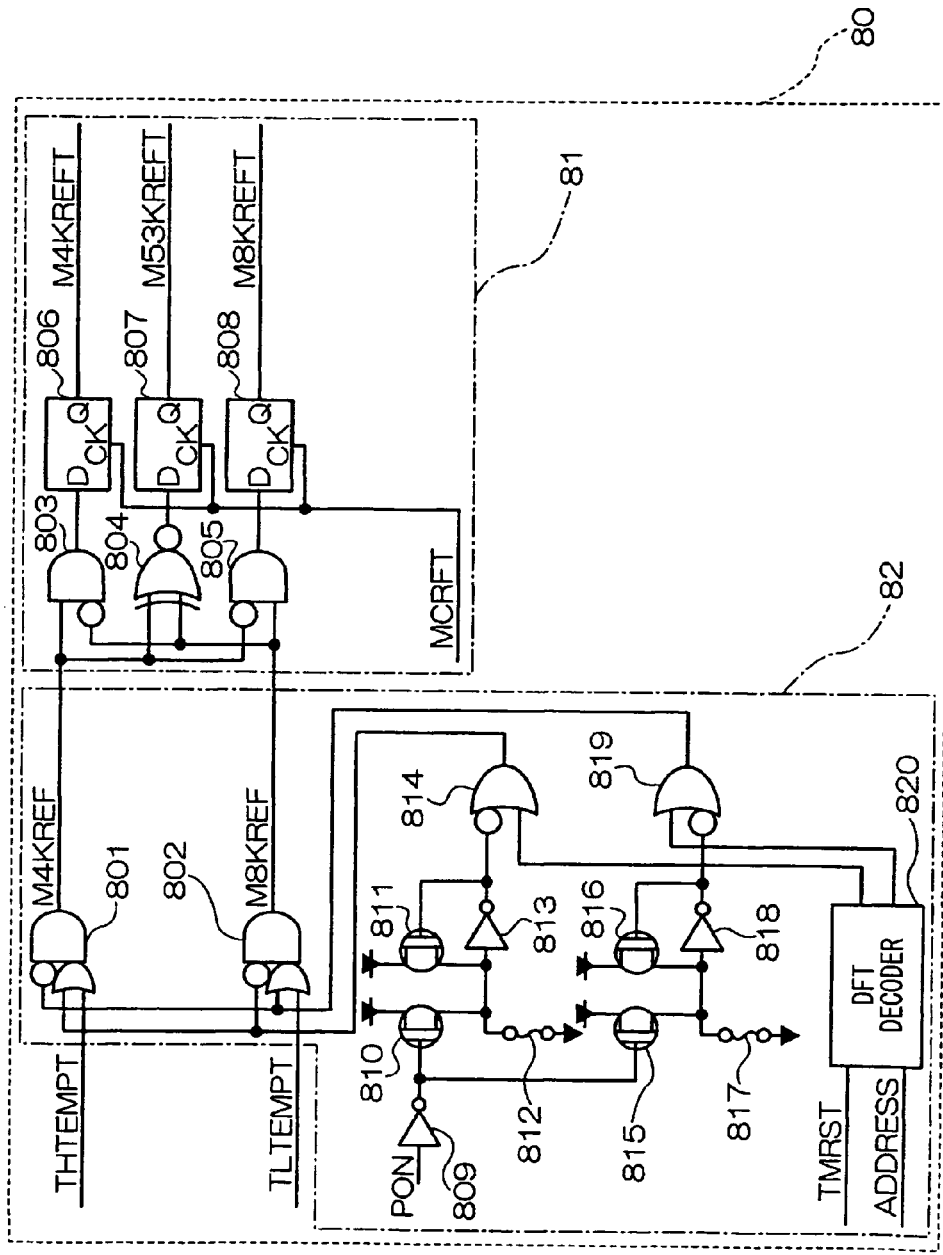
FIG. 5 is a circuit diagram illustrating the configuration of a refresh number setting circuit included in the semiconductor memory device of FIG. 1.
Figures 6, 7:
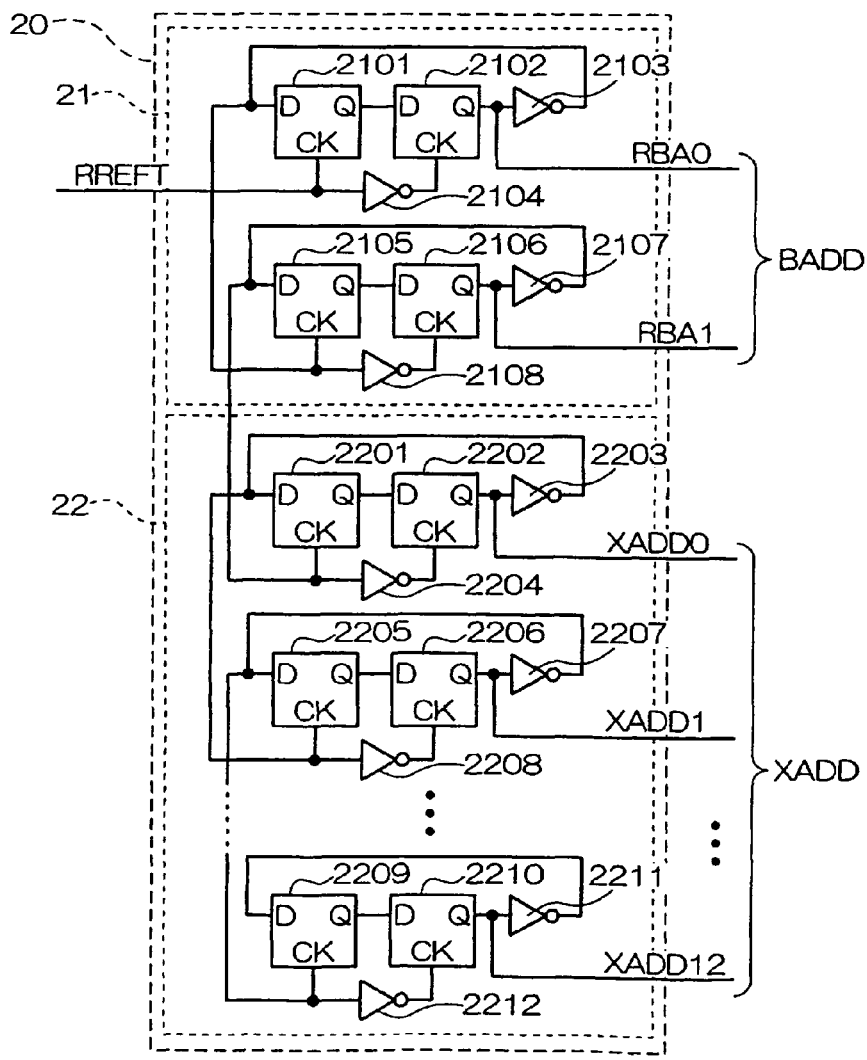
FIG. 6 is a truth table showing input-output characteristic of the refresh number setting circuit of FIG. 5.
FIG. 7 is a circuit diagram illustrating the configuration of a counter circuit included in the semiconductor memory device of FIG. 1.

FIG. 6 is a truth value table in which the input and output relations of the refresh number setting circuit 80 shown in FIG. 5 are arranged. When the temperature of the semiconductor device is lower than a predetermined temperature A, the signal M8KREF is in the "H" level. When the temperature of the semiconductor device is equal to or higher than the predetermined temperature A and is lower than a predetermined temperature B, the signal M53KREF is in the "H" level. When the temperature of the semiconductor device is equal to or higher than the temperature B, the signal M4KREF is in the "H" level. In this way, one of the signal M8KREF, the signal M53KREF, and the signal M4KREF is in the "H" level. Therefore, one operation mode can be selected out of three operation modes depending on the temperature.

The D flip-flops 806 to 808 are a circuit changing the level of the input D to be equal to the level of the output Q when a clock input CK is in the "H" level and retaining the level of the output Q when the clock input CK is in the "L" level. The refresh signal MCRFT is input as the clock input CK to the D flip-flops 806 to 808. The refresh signal MCRFT is a pulse-like signal with a predetermined pulse width being once in the "H" level when the auto-refresh command is input and the auto-refresh operation is started. Accordingly, whenever the signal in the "H" level is input as the refresh signal MCRFT, the refresh number setting circuit 80 changes the outputs M4KREF, M53KREF, and M8KREF on the basis of the inputs THTEMPT and TLTEMPT, and retains and outputs while the refresh signal MCRFT is in the "L" level. Therefore, the temperature detection result of the temperature detector circuit 70 before starting the auto-refresh (AREF) operation is input, thereby preventing the change in operation mode during the AREF period.

The configuration of the counter circuit 20 shown in FIG. 1 will be described with reference to FIG. 7. The counter circuit 20 shown in FIG. 7 includes a bank address counter 21 and an X address counter 22. The bank address counter 21 counts the input refresh start signal RREFT and outputs 2-bit signals including a signal BA0 and a signal BA1 acquired as the counting result as the bank address BADD. The X address counter 22 counts the signal BA1 and outputs the X address XADD including 13-bit signals XADD0, XADD1, . . . , XADD12.

The bank address counter 21 includes a D flip-flop 2101, a D flip-flop 2102, an inverter 2103, an inverter 2104, a D flip-flop 2105, a D flip-flop 2106, an inverter 2107, and an inverter 2108. In this case, the output Q of the D flip-flop 2101 is connected to the input D of the D flip-flop 2102, the output Q of the D flip-flop 2102 is connected to the input of the inverter 2103, and the output of the inverter 2103 is connected to the input D of the D flip-flop 2101. The refresh start signal RREFT is input to the clock input CK of the D flip-flop 2101 and the inverter 2104, and the output of the inverter 2104 is input to the clock input CK of the D flip-flop 2102. The output Q of the D flip-flop 2102 is a signal RBA0 of the lowest bit of the X address XADD. The output Q of the D flip-flop 2105 is connected to the input D of the D flip-flop 2106, the output Q of the D flip-flop 2106 is connected to the input of the inverter 2107, and the output of the inverter 2107 is connected to the input D of the D flip-flop 2105. The output of the inverter 2103 is input to the clock input CK of the D flip-flop 2105 and the inverter 2108, and the output of the inverter 2108 is input to the clock input CK of the D flip-flop 2106. The output Q of the D flip-flop 2106 is a signal RBA1 of the second bit from the lowest bit of the X address XADD.

In the above-mentioned configuration, the D flip-flop 2101, the D flip-flop 2102, the inverter 2103, and the inverter 2104 constitute a one-bit counter circuit changing the level of the signal RBA0 from "H" to "L" or from "L" to "H" whenever the refresh start signal RREFT is changed from the "H" level to the "L" level. The D flip-flop 2105, the D flip-flop 2106, the inverter 2107, and the inverter 2108 constitute a one-bit counter circuit changing the level of the signal RBA1 from "H" to "L" or from "L" to "H" whenever the signal RBA0 is changed from the "H" level to the "L" level. Accordingly, the two-bit counter circuit is constituted by the circuits and the signal RBA0 and the signal RBA1 are output as the count result of the two-bit counter. That is, the signal RBA0 and the RBA1 form a two-bit signal counted up to "0", "1", "2", "3", "0", "1", "2", "3", . . . whenever the refresh start signal RREFT is changed from the "H" level to the "L" level.

On the other hand, the X address counter 22 includes a D flip-flop 2201, a D flip-flop 2202, an inverter 2203, an inverter 2204, a D flip-flop 2205, a D flip-flop 2206, an inverter 2207, an inverter 2208, . . . , a D flip-flop 2209, a D flip-flop 2210, an inverter 2211, and an inverter 2212.

In this case, the output Q of the D flip-flop 2201 is connected to the input D of the D flip-flop 2202, the output Q of the D flip-flop 2202 is connected to the input of the inverter 2203, and the output of the inverter 2203 is connected to the input D of the D flip-flop 2201. The signal obtained by inverting the signal RBA1 by the use of the inverter 2107 is input to the clock input CK of the D flip-flop 2201 and the inverter 2204, and the output of the inverter 2204 is input to the clock input CK of the D flip-flop 2202. The output Q of the D flip-flop 2202 is a signal XADD0 of the lowest bit of the X address XADD. The output Q of the D flip-flop 2205 is connected to the input D of the D flip-flop 2206, the output Q of the D flip-flop 2206 is connected to the input of the inverter 2207, and the output of the inverter 2207 is connected to the input D of the D flip-flop 2205. The output of the inverter 2203 is input to the clock input CK of the D flip-flop 2205 and the inverter 2208, and the output of the inverter 2208 is input to the clock input CK of the D flip-flop 2206. The output Q of the D flip-flop 2206 is a signal XADD1 of the second bit from the lowest bit of the X address XADD. The output Q of the D flip-flop 2209 is connected to the input D of the D flip-flop 2210, the output Q of the D flip-flop 2210 is connected to the input of the inverter 2211, and the output of the inverter 2211 is connected to the input D of the D flip-flop 2209. The signal obtained by inverting the signal XADD11 (not shown) by the use of the inverter is input to the clock input CK of the D flip-flop 2209 and the inverter 2212, and the output of the inverter 2212 is input to the clock input CK of the D flip-flop 2210. The output Q of the D flip-flop 2210 is a signal XADD12 of the highest bit (the thirteenth bit from the lowest bit) of the X address XADD. The X address counter 22 includes 13 sets of configurations for outputting the signals XADD1 to XADD12 of the bits of the X address XADD.

In the above-mentioned configuration, the D flip-flop 2201, the D flip-flop 2202, the inverter 2203, and the inverter 2204 constitute a one-bit counter circuit changing the level of the signal XADD0 from "H" to "L" or from "L" to "H" whenever the signal RBA1 is changed from the "L" level to the "H" level. The D flip-flop 2205, the D flip-flop 2206, the inverter 2207, and the inverter 2208 constitute a one-bit counter circuit changing the level of the signal XADD1 from "H" to "L" or from "L" to "H" whenever the signal XADD0 is changed from the "L" level to the "H" level. The D flip-flop 2209, the D flip-flop 2210, the inverter 2211, and the inverter 2212 constitute a one-bit counter circuit changing the level of the signal XADD12 from "H" to "L" or from "L" to "H" whenever the signal XADD11 (not shown) is changed from the "L" level to the "H" level. Accordingly, a 13-bit counter circuit is constituted by the circuits and the signal XADD0, the signal XADD1, . . . , and the signal XADD12 are output as the count result of the 13-bit counter. That is, the signal XADD0, the signal XADD1, and the signal XADD12 form a 13-bit signal counted up to "0", "1", "2", "3", . . . , "$2^{13}-2$ (=8192−2)", "$2^{13}-1$ (=8192−1)", "0", "1", "2", "3", . . . whenever the inverted signal of the highest bit signal RBA1 as the carry signal of the bank address counter 21 is changed from the "H" level to the "L" level.

Figure 8:
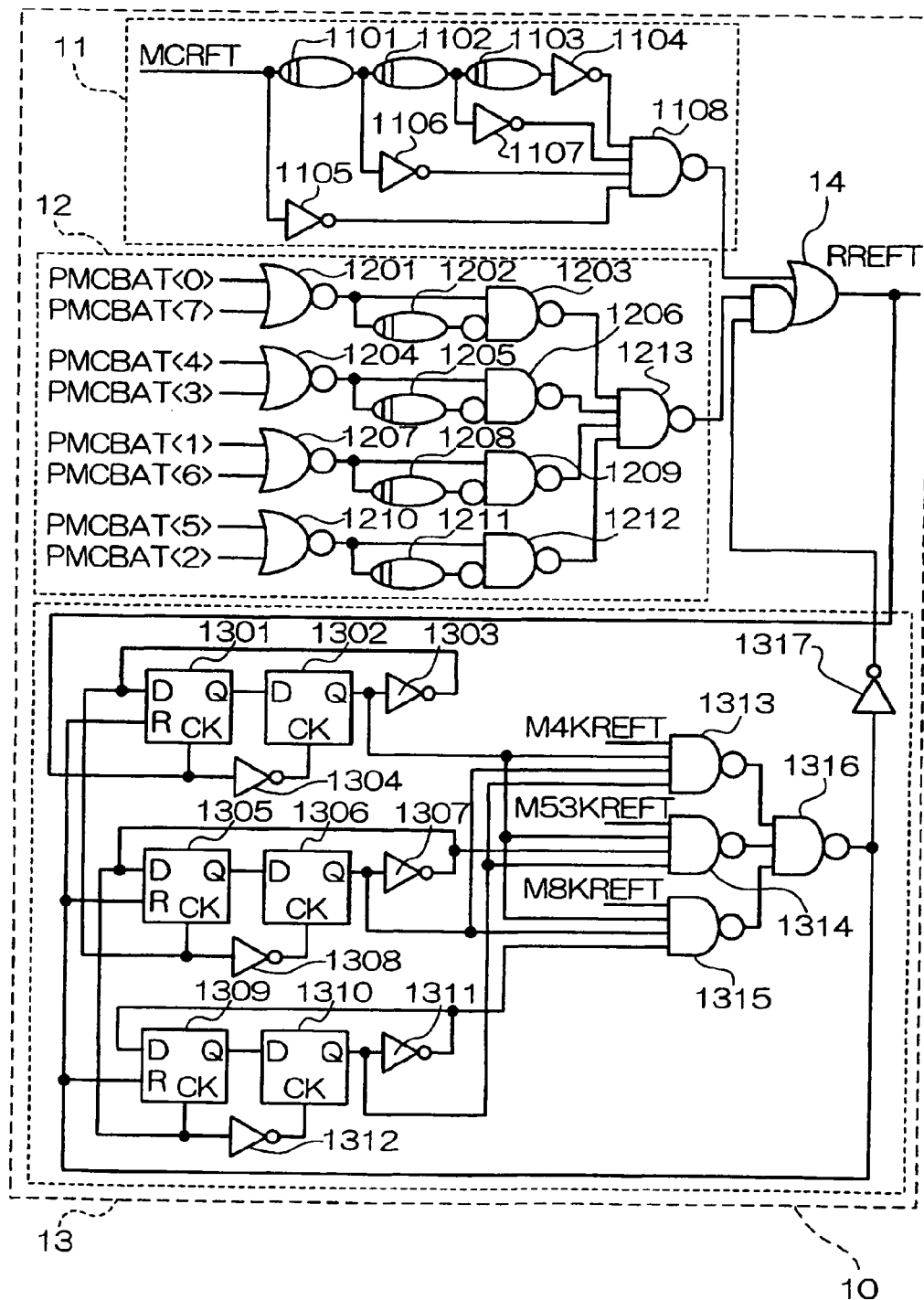
FIG. 8 is a circuit diagram illustrating the configuration of a refresh start signal generating circuit included in the semiconductor memory device of FIG. 1.
Figure 9:
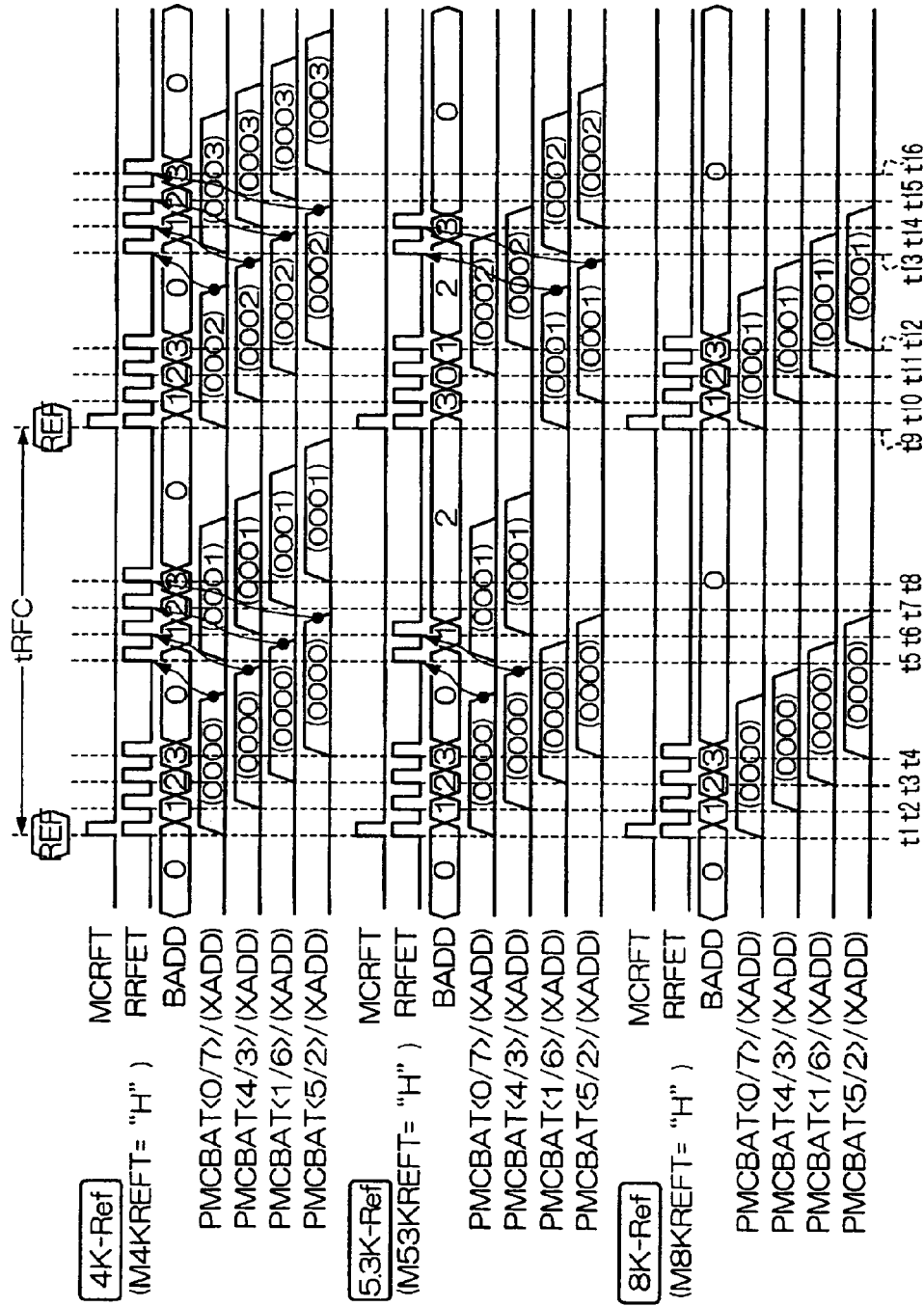
FIG. 9 is a timing chart illustrating operations of the semiconductor memory device of FIG. 1.

The configuration and the operation of the refresh start signal generator circuit 10 shown in FIG. 1 will be described with reference to FIGS. 8 and 9. FIG. 8 is a block diagram illustrating the configuration of the refresh start signal generator circuit 10 shown in FIG. 1. FIG. 9 is a timing diagram illustrating operating waveforms of the units of the semiconductor memory device 1 shown in FIG. 1. Here, in FIG. 9, the 4KREF mode in which the refresh process is performed twice during the tRFC period, the 5.3KREF mode in which 1.5 refresh processes are performed during the same period, and the 8KREF mode in which one refresh process is performed during the same period are vertically arranged in this order. In this case, signal waveforms of the refresh signal MCRFT, the refresh start signal RREFT, the bank address BADD, and the refresh control signals PMCBATi (where i is an integer of 0 to 7) are shown every mode. The count value of the bank address BADD is expressed by numerals ("0" to "3"), the signal generation time of the refresh control signals PMCBATi (where i is an integer of 0 to 7) is expressed by waveforms, and the values of the X addresses XADD supplied from the X address selector/buffer circuit 60 to the memory banks are expressed by numerals surrounded with parentheses ("(0000)", "(0001)", ... ).

The refresh start signal generator circuit 10 shown in FIG. 8 includes three blocks 11, 12, and 13, and a two-AND-OR complex gate 14. The block 11 is a circuit outputting four pulse-like signals in response to the refresh signal MCRFT input from the command receiver/decoder 40 shown in FIG. 1. The complex gate 14 outputs four pulse-like refresh start signals RREFT on the basis of the output of the block 11 (for example, four pulse-like refresh start signals RREFT generated at times t1, t2, t3, and t4 in FIG. 9).

In the example shown in FIG. 8, the block 11 includes three delay elements 1101, 1102, and 1103 connected in series to each other, an inverter 1105 having the refresh signal MCRFT as an input, three inverters 1106, 1107, and 1104 having the outputs of the delay elements 1101, 1102, and 1103 as their inputs, respectively, and a NAND gate 1108 having the outputs of the inverters 1105, 1106, 1107, and 1104 as four inputs. The refresh signal MCRFT is input to the delay element 1101. The output of the NAND gate 1108 is connected to the OR input of the complex gate 14.

The block 12 outputs a pulse-like signal at different falling times of the refresh control signals PMCBATi input from the refresh operation control circuit 50 shown in FIG. 1. In this embodiment, the refresh control signals PMCBAT0 and PMCBAT7, the refresh control signals PMCBAT4 and PMCBAT3, the refresh control signals PMCBAT1 and PMCBAT6, and the refresh control signals PMCBAT5 and PMCBAT2 are signals having the same timing. Accordingly, when each refresh control signal PMCBATi falls once (is changed from "H" to "L"), four pulse-like signals in total are output. Since the output of the block 12 is connected to the AND input of the complex gate 14, the pulse-like signal can be generated as the output of the complex gate 14 or not depending on the output signal of the block 13 which is another AND input. In the example shown in FIG. 9, four pulse-like refresh start signals RREFT are output at times t5, t6, t7, and t8 in the 4KREF mode depending on the output of the block 12. Two pulse-like refresh start signals RREFT are output at times t5 and t6 in the 5.3KREF mode depending on the output of the block 12. However, the refresh start signal RREFT is not generated in the 8KREF mode depending on the output of the block 12.

In the example shown in FIG. 8, one pulse-like signal is generated in correspondence to the falling of the refresh control signals PMCBAT0 and PMCBAT7 by a NOR gate 1201 having the refresh control signals PMCBAT0 and PMCBAT7 as two inputs, a delay element 1202 having the output of the NOR gate 1201 as an input, and a NAND gate 1203 having the output of the NOR gate 1201 as a positive logical input and the output of the delay element 1202 as a negative logical input. One pulse-like signal is generated in correspondence to the falling of the refresh control signals PMCBAT4 and PMCBAT3 by a NOR gate 1204 having the refresh control signals PMCBAT4 and PMCBAT3 as two inputs, a delay element 1205 having the output of the NOR gate 1204 as an input, and a NAND gate 1206 having the output of the NOR gate 1204 as a positive logical input and the output of the delay element 1205 as a negative logical input. One pulse-like signal is generated in correspondence to the falling of the refresh control signals PMCBAT1 and PMCBAT6 by a NOR gate 1207 having the refresh control signals PMCBAT1 and PMCBAT6 as two inputs, a delay element 1208 having the output of the NOR gate 1207 as an input, and a NAND gate 1209 having the output of the NOR gate 1207 as a positive logical input and the output of the delay element 1208 as a negative logical input. One pulse-like signal is generated in correspondence to the falling of the refresh control signals PMCBAT2 and PMCBAT5 by a NOR gate 1210 having the refresh control signals PMCBAT2 and PMCBAT5 as two inputs, a delay element 1211 having the output of the NOR gate 1210 as an input, and a NAND gate 1212 having the output of the NOR gate 1210 as a positive logical input and the output of the delay element 1211 as a negative logical input. The output of a NAND gate 1213 having the outputs of the NANDs 1203, 1206, 1209, and 1212 as four inputs is connected to the AND input of the complex gate 14.

The block 13 constitutes a counter counting the number of pulse-like activating signals RREFT output from the complex gate 14 while changing the maximum value of the count value depending on the refresh modes. The block 13 outputs a signal in the "H" level before the counter of the block 13 reaches the maximum value, and outputs a signal in the "L" level when the counter of the block 13 reaches the maximum value. The output of the block 13 is input to the AND input of the complex gate 14 of which one AND input is connected to the output of the block 12. Accordingly, after the output of the block 13 reaches the "L" level, the pulse-like refresh start signal RREFT corresponding to the output of the block 12 is not output from the complex gate 14. That is, after the number of pulse-like signals of the input refresh start signals RREFT reaches the maximum value set depending on the refresh modes, the refresh start signal RREFT based on the output of the block 12 is not generated.

Specifically, when 8 refresh start signals RREFT are generated in the 4KREF mode, the output of the block 13, that is, the output of the inverter 1317, is changed to the "L" level. When 6 refresh start signals RREFT are generated in the 5.3KREF mode, the output of the block 13, that is, the output of the inverter 1317, is changed to the "L" level. When 4 refresh start signals RREFT are generated in the 8KREF mode, the output of the block 13, that is, the output of the inverter 1317, is changed to the "L" level. The counter of the block 13 is reset by the input of the next refresh start signal RREFT after reaching the maximum value, and counts up to "0", "1", ..., again. After the maximum value is reached (after the output of the block 13 is changed to the "L" level), the refresh start signal RREFT is not generated in accordance with the output of the block 12. Accordingly, only when the refresh start signal RREFT is generated in accordance with the output of the block 11, that is, the refresh signal MCRFT, the counter of the block 13 is reset and counts up again. In the example shown in FIG. 9, the numbers of output refresh start signals RREFT in the refresh modes are different from each other depending on the output of the block 12, that is, depending on the falling of the refresh control signal PMCBATi, which is because the maximum value set in the counter of the block 13 is changed.

In the example shown in FIG. 8, in the block 13, a lowest-bit counter is constituted by a D flip-flop 1301, a D flip-flop 1302, an inverter 1303, and an inverter 1304. In this case, the output Q of the D flip-flop 1301 is connected to the input D of the D flip-flop 1302, the output Q of the D flip-flop 1302 is connected to the input of the inverter 1303, and the output of the inverter 1303 is connected to the input D of the D flip-flop 1301. The refresh start signal RREFT output from the complex gate 14 is input to the clock input CK of the D flip-flop 1301 and the inverter 1304, and the output of the inverter 1304 is input to the clock input CK of the D flip-flop 1302. The output of the NAND gate 1316 is connected to the reset input of the D flip-flop 1301.

In the block 13, a second-bit counter is constituted by a D flip-flop 1305, a D flip-flop 1306, an inverter 1307, and an inverter 1308. In this case, the output Q of the D flip-flop 1305 is connected to the input D of the D flip-flop 1306, the output Q of the D flip-flop 1306 is connected to the input of the inverter 1307, and the output of the inverter 1307 is connected to the input D of the D flip-flop 1305. The output of the inverter 1303 in the first-bit counter is input to the clock input CK of the D flip-flop 1305 and the inverter 1308, and the output of the inverter 1308 is input to the clock input CK of the D flip-flop 1306. The output of the NAND gate 1316 is connected to the reset input of the D flip-flop 1305.

In the block 13, a third-bit counter is constituted by a D flip-flop 1309, a D flip-flop 1310, an inverter 1311, and an inverter 1312. In this case, the output Q of the D flip-flop 1309 is connected to the input D of the D flip-flop 1310, the output Q of the D flip-flop 1310 is connected to the input of the inverter 1311, and the output of the inverter 1311 is connected to the input D of the D flip-flop 1309. The output of the inverter 1307 in the second-bit counter is input to the clock input CK of the D flip-flop 1309 and the inverter 1312, and the output of the inverter 1312 is input to the clock input CK of the D flip-flop 1310. The output of the NAND gate 1316 is connected to the reset input of the D flip-flop 1309.

The block 13 includes NAND gates 1313, 1314, 1315, and 1316 as a circuit for setting the maximum value of the three-bit counter. The M4KREFT signal output from the refresh number setting circuit 80 and the outputs of the D flip-flops 1302, 1306, and 1310 are input to the NAND 1313. Accordingly, the output of the NAND gate 1313 is in the "L" level when the M4KREFT signal is in the "H" level and the outputs of the three-bit counter are all in the "H" level (="111"=7). The M53KREFT signal output from the refresh number setting circuit 80 and the outputs of the D flip-flop 1302, the inverter 1307, and the D flip-flop 1310 are input to the NAND 1314. Accordingly, the output of the NAND gate 1314 is in the "L" level when the M53KREFT signal is in the "H" level and the outputs of the three-bit counter are "101"=5. The M8KREFT signal output from the refresh number setting circuit 80 and the outputs of the D flip-flops 1302 and 1306 and the inverter 1311 are input to the NAND 1315. Accordingly, the output of the NAND gate 1315 is in the "L" level when the M8KREFT signal is in the "H" level and the outputs of the three-bit counter are "011"=3.

The NAND 1316 outputs the signal in the "H" level when one output of the NAND gates 1313, 1314, and 1315 is in the "L" level, that is, when the count value reaches the maximum value in any refresh mode. The inverter 1317 inverts the output of the NAND gate 1316. Accordingly, the output of the inverter 1317 is in the "L" level when the count value reaches the maximum value in any refresh mode, and is in the "H" level before the count value reaches the maximum value. When the output of the NAND gate 1316 is changed to the "H" level, the D flip-flops 1301, 1305, and 1309 are reset and the outputs Q of the D flip-flops 1301, 1305, and 1309 are changed to the "L" level. However, the outputs Q of the D flip-flops 1302, 1306, and 1310 are retained in the maximum value when the D flip-flops 1301, 1305, and 1309 are reset, and the outputs Q are reset to the "L" level when the clock input CK of the D flip-flops 1302, 1306, and 1310 are changed to the "H" level.

According to the above-mentioned configuration, as shown in FIG. 9, when the refresh signal MCRFT is generated in the 4KREF mode (time t1), the refresh start signal RREFT is output four times from the refresh start signal generator circuit 10 (times t1, t2, t3, and t4). The counter circuit 20 counts up the bank address BADD from "0" to "1", "2", "3", and "0" in response to the four refresh start signals RREFT, when the initial values before time t1 are all "0". When the bank address BADD carries (returning to "0" at "3") in response to the refresh start signal RREFT at time t4, the X address XADD is changed to "0001" from the initial value "0000". Here, the X address selector/buffer circuit 60 receives, retains, and outputs the X address XADD at times t1, t2, t3, and t4 when the refresh start signals RREFT are generated, respectively. Accordingly, until the next refresh start signal RREFT is generated at time t5, the X address XADD of the refresh target is not changed from the initial value "0000".

As shown in FIG. 9, the refresh control signals PMCBATi are changed to the "H" level by the refresh operation control circuit 50 on the basis of the refresh start signals RREFT and the bank address BADD. The refresh operation control circuit 50 sets the refresh control signals PMCBATi to the "H" level for a predetermined time necessary for the refresh process and then sets the refresh control signals PMCBATi to the "L" level. With the falling from the "H" level to the "L" level, the refresh start signal RREFT is output four times from the refresh start signal generator circuit 10 (at times t5, t6, t7, and t8, respectively).

The counter circuit 20 counts up the bank address BADD from "0" to "1", "2", "3", and "0" in response to the four refresh start signals RREFT at the second time. When the bank address BADD carries (returning to "0" at "3") in response to the refresh start signal RREFT at time t8, the X address XADD is changed to "0002" from the initial value "0001". Here, the X address selector/buffer circuit 60 receives, retains, and outputs the X address XADD at times t5, t6, t7, and t8 when the refresh start signals RREFT are generated, respectively. Accordingly, until the next refresh start signal RREFT is generated at time t9, the X address XADD of the refresh target is not changed from the value "0001".

As shown in FIG. 9, the refresh control signals PMCBATi are changed to the "H" level by the refresh operation control circuit 50 on the basis of the refresh start signals RREFT and the bank address BADD. The refresh operation control circuit 50 sets the refresh control signals PMCBATi to the "H" level for a predetermined time necessary for the refresh process and then sets the refresh control signals PMCBATi to the "L" level. At time t8, the number of generated refresh start signals RREFT in the 4KREF mode reaches 8 which is the maximum value. Accordingly, after time t8, the refresh start signal RREFT is not generated with the falling of the refresh control signals PMCBATi.

When the auto-refresh command is input and the refresh signal MCRFT is generated (time t9), 8 (=4+4) refresh start signals RREFT are generated again (times t9, t10, t11, t12, t13, t14, t15, and t16), and the bank address BADD is changed from "0" to "1", "2", "3", "0", "1", "2", "3", and "0". Since the bank address BADD is changed from "3" to "0" twice, the X address is changed from "0002" to "0003" and from "0003" to "0004". Here, at times t9 to t12, the X address XADD input to the X address selector/buffer circuit 60 is retained in "0002". At times t13 to t16, the X address XADD input to the X address selector/buffer circuit 60 is retained in "0003".

In this way, when two auto-refresh commands are input in the 4KREF mode, the refresh process for the X addresses of "0000" to "0003" is performed on all the memory banks 0 (100) to 7 (170).

In the 5.3KREF mode, when the refresh signal MCRFT is generated (time t1), the refresh start signal RREFT is output four times from the refresh start signal generator circuit 10 (times t1, t2, t3, and t4). The counter circuit 20 counts up the bank address BADD from "0" to "1", "2", "3", and "0" in response to the four refresh start signals RREFT, when the initial values before time t1 are all "0". When the bank address BADD carries (returning to "0" at "3") in response to the refresh start signal RREFT at time t4, the X address XADD is changed to "0001" from the initial value "0000". Here, the X address selector/buffer circuit 60 receives, retains, and outputs the X address XADD at times t1, t2, t3, and t4 when the refresh start signals RREFT are generated, respectively. Accordingly, until the next refresh start signal RREFT is generated at time t5, the X address XADD of the refresh target is not changed from the initial value "0000".

As shown in FIG. 9, the refresh control signals PMCBATi are changed to the "H" level by the refresh operation control circuit 50 on the basis of the refresh start signals RREFT and the bank address BADD. The refresh operation control circuit 50 sets the refresh control signals PMCBATi to the "H" level for a predetermined time necessary for the refresh process and then sets the refresh control signals PMCBATi to the "L" level. With the falling of the refresh control signals PMCBAT<0/7> and PMCBAT<4/3> from the "H" level to the "L" level, the refresh start signal RREFT is output twice from the refresh start signal generator circuit 10 (at times t5 and t6, respectively). At time t6, the number of generated refresh start signals RREFT in the 5.3KREF mode reaches 6 which is the maximum value. Accordingly, after time t8, the refresh start signal RREFT is not generated with the falling of the refresh control signals PMCBAT<1/6> and PMCBAT<5/2>.

The counter circuit 20 counts up the bank address BADD from "0" to "1" and "2" in response to the two refresh start signals RREFT at the second time. The X address selector/buffer circuit 60 receives, retains, and outputs the X address XADD at times t5 and t6 when the refresh start signals RREFT are generated; respectively. Accordingly, until the next refresh start signal RREFT is generated at time t9, the X address XADD of the refresh target is retained in the value "0001".

As shown in FIG. 9, two sets of refresh control signals PMCBAT<0/7> and PMCBAT<4/3> are changed to the "H" level (times t5 and t6) by the refresh operation control circuit 50 on the basis of the refresh start signals RREFT and the bank address BADD. The refresh operation control circuit 50 sets the refresh control signals PMCBAT<0/7> and PMCBAT<4/3> to the "H" level for a predetermined time necessary for the refresh process and then sets the refresh control signals PMCBAT<0/7> and PMCBAT<4/3> to the "L" level.

When the refresh signal MCRFT is generated (time t9), 6 (=4+2) refresh start signals RREFT are generated again (times t9, t10, t11, t12, t13, and t14), and the bank address BADD is changed from "2" to "3", "0", "1", "2", "3", and "0". Since the bank address BADD is changed from "3" to "0" twice, the X address is changed from "0001" to "0002" and from "0002" to "0003". Here, at times t9 and t10, the X address XADD input to the X address selector/buffer circuit 60 is retained in "0001". At times t11 to t14, the X address XADD input to the X address selector/buffer circuit 60 is retained in "0002".

In this way, when two auto-refresh commands are input in the 5.3KREF mode, the refresh process for the X addresses of "0000" to "0002" is performed on all the memory banks 0 (100) to 7 (170).

In the 8KREF mode, when the refresh signal MCRFT is generated (time t1), the refresh start signal RREFT is output four times from the refresh start signal generator circuit 10 (times t1, t2, t3, and t4). The counter circuit 20 counts up the bank address BADD from "0" to "1", "2", "3", and "0" in response to the four refresh start signals RREFT, when the initial values before time t1 are all "0". When the bank address BADD carries (returning to "0" at "3"), the X address XADD is changed to "0001" from the initial value "0000". Here, the X address selector/buffer circuit 60 receives, retains, and outputs the X address XADD at times t1, t2, t3, and t4 when the refresh start signals RREFT are generated, respectively. Accordingly, until the next refresh start signal RREFT is generated at time t5, the X address XADD of the refresh target is not changed from the initial value "0000".

As shown in FIG. 9, the refresh control signals PMCBATi are changed to the "H" level by the refresh operation control circuit 50 on the basis of the refresh start signals RREFT and the bank address BADD (times t1, t2, t3, and t4). The refresh operation control circuit 50 sets the refresh control signals PMCBATi to the "H" level for a predetermined time necessary for the refresh process and then sets the refresh control signals PMCBATi to the "L" level. At the time point when the fourth refresh start signal RREFT is generated at time t4, the number of generated refresh start signals RREFT in the 8KREF mode reaches 4 which is the maximum value. Accordingly, in the 8KREF mode, the refresh start signal RREFT is not generated with the falling of the refresh control signals PMCBATi.

When the refresh signal MCRFT is generated (time t9), 4 refresh start signals RREFT are generated again (times t9, t10, t11, and t12), and the bank address BADD is changed from "0" to "1", "2", "3", and "0". Since the bank address BADD is changed from "3" to "0" once, the X address is changed from "0001" to "0002". Here, at times t9, t10, t11, and t12, the X address XADD input to the X address selector/buffer circuit 60 is retained in "0001".

In this way, when the auto-refresh command is input twice in the 8KREF mode, the refresh process for the X addresses of "0000" to "0001" is performed on all the memory banks 0 (100) to 7 (170).

As described above, in this embodiment, when the auto-refresh command is decoded and the refresh signal MCRFT is changed to the "H" level, the information of the outputs THTEMPT and TLTEMPT of the temperature detector circuit 70 is latched by the D latch of the refresh number setting circuit 80. The refresh controller 2 operates on the basis of the latched outputs THTEMPT and TLTEMPT, and the refresh operation is performed on the memory banks 0 (100) to 7 (170). When the refresh signal MCRFT is changed from "L" to "H" after the refresh operation is ended, the outputs THTEMPT and TLTEMPT of the temperature detector circuit 70 are input to the D latch of the refresh number setting circuit 80.

Although it has been described in this embodiment that the refresh operation is performed in a time division manner by two banks, the method of performing a refresh operation may be modified in various forms such as a method of refreshing all the banks at a time or a method of refreshing the banks in a time division manner four banks at a time. The method of counting the X address XADD is not particularly limited.

Figure 10:
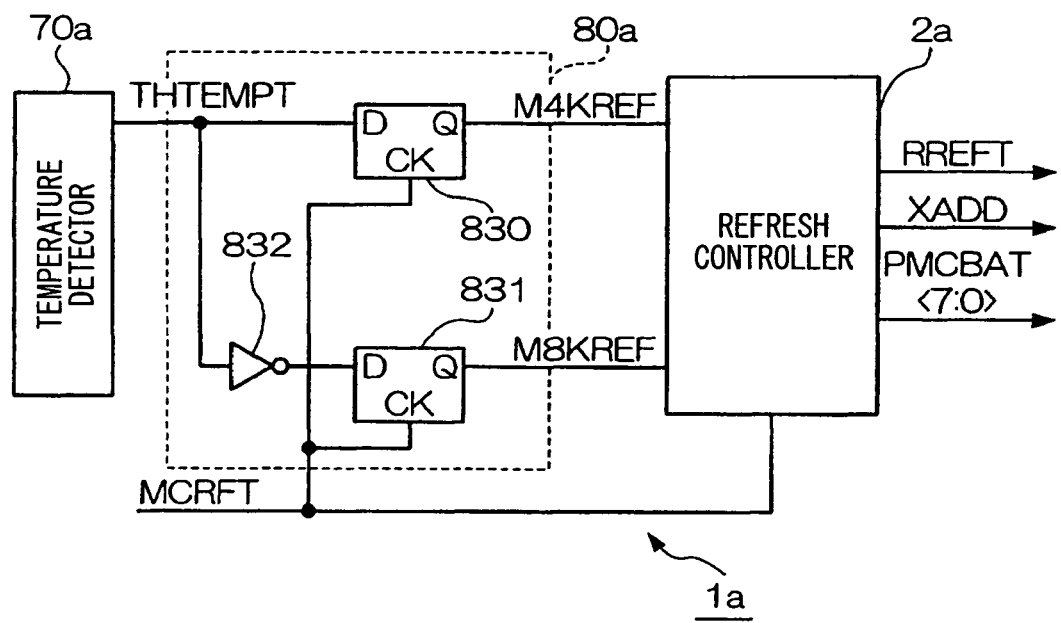
FIG. 10 is a block diagram illustrating a semiconductor memory device in accordance with another embodiment of the present invention.

Another embodiment of the invention will be described now with reference to FIG. 10. In a semiconductor memory device 1a shown in FIG. 10, a temperature detector circuit 70a, a refresh number setting circuit 80a, and a refresh controller 2a are provided instead of the temperature detector circuit 70, the refresh number setting circuit 80, and the refresh controller 2 shown in FIG. 1. The temperature detector circuit 70a is obtained by removing the circuit (such as the comparator 712) used for the output of the signal TLTEMPT from the temperature detector circuit 70 shown in FIG. 2. The refresh number setting circuit 80a includes a D flip-flop 830 latching the signal THTEMPT output from the temperature detector circuit 70a in response to the refresh signal MCRFT (using the refresh signal MCRFT as the clock input CK) and a D flip-flop 831 latching the signal obtained by inverting the signal THTEMPT by the use of the inverter 832. The output of the D flip-flop 830 is input as the M4KREF signal to the refresh controller 2a and the output of the D flip-flop 831 is input as the M8KREF signal to the refresh controller 2a. The refresh controller 2a has almost the same configuration as the above-mentioned embodiment, that is, a configuration in which a circuit for fixing the M53KREF signal to the "L" level is added thereto.

In this embodiment, the refresh modes are limited to two of the 4KREF mode and the 8KREF mode. The temperature detector circuit 70a operates so as to set the signal THTEMPT to the "L" level when the temperature is equal to or lower than a predetermined temperature and to set the signal THTEMPT to the "H" level when the temperature is higher than the predetermined temperature. The operation mode can be switched between two modes of the 8KREF mode at a low temperature and the 4KREF mode at a high temperature. The operation mode is switched between 8K and 4K in FIG. 10, but combinations of 8K and 5.3K or 5.3K and 4K may be considered. A method of 16KREF mode (16K-refresh) may be employed in powerful products.

For the semiconductor memory device 1 in accordance with this embodiment, the configurations and operations to control the auto-refresh have been descried above. The semiconductor memory device 1 in accordance with this embodiment may be configured to select one of the auto-refresh and self-refresh operations to perform the refresh operation of the memory cells. The known configurations and operations for controlling the self-refresh may be available. An example of the configuration to perform the self-refresh operation will be described with reference to FIGS. 11 and 12.

Figure 11:
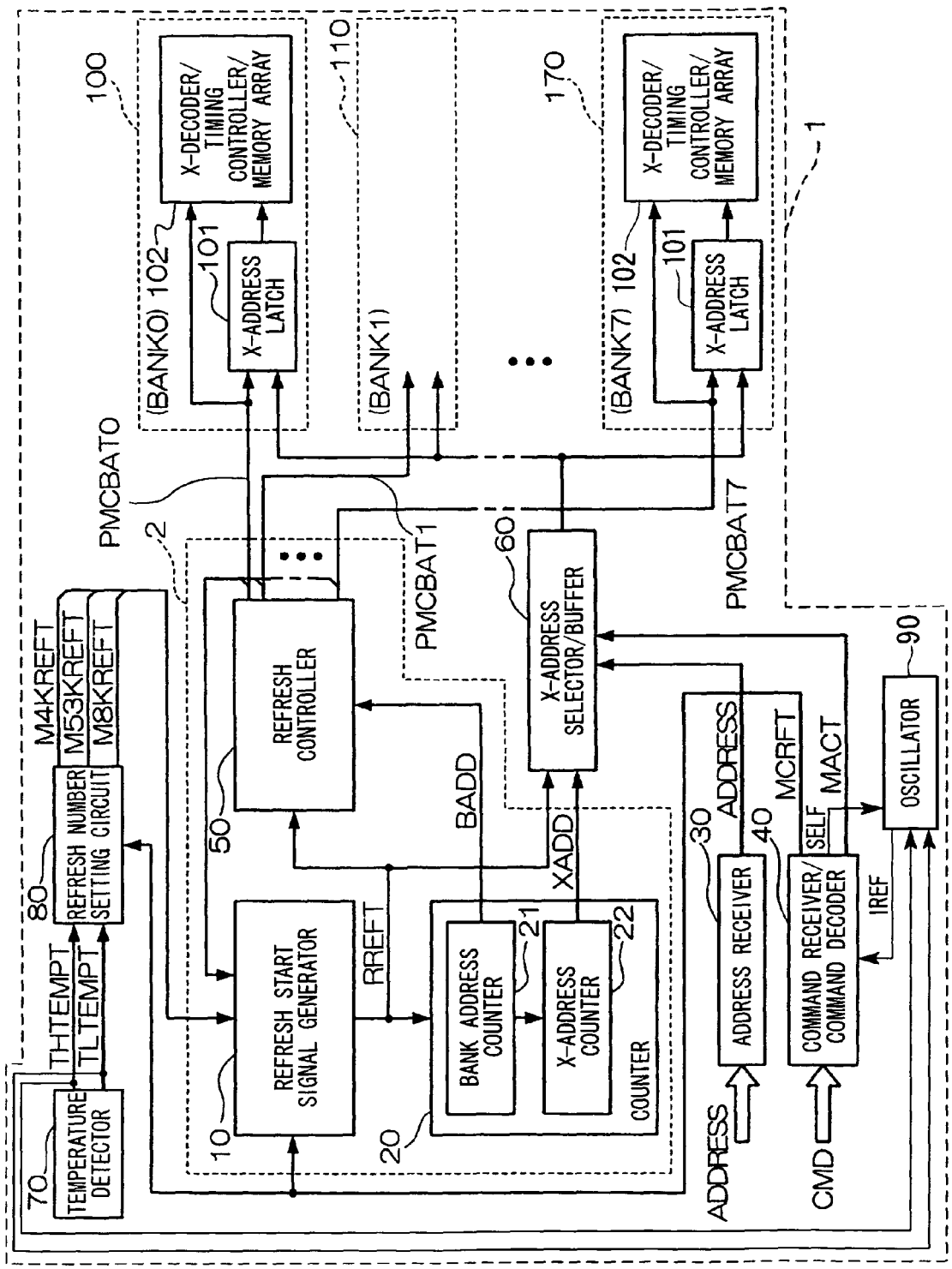
FIG. 11 is a block diagram illustrating a semiconductor memory device including an oscillator which controls self-refresh operations.

FIG. 11 is a block diagram illustrating a semiconductor memory device including an oscillator 90 which controls self-refresh operations. The semiconductor memory device 1 shown in FIG. 11 is different from the semiconductor device 1 shown in FIG. 1 in further including the oscillator 90. The command receiver/decoder 40 generates the refresh execution signal MCRFT and activates a self-refresh state signal SELF when the decoded command CMD is the self-refresh command. The self-refresh state signal SELF is maintained active, for example, in the "H" level in a period of time when the self-refresh operation is performed. Once the oscillator 90 receives the activated self-refresh state signal SELF, the oscillator 90 supplies an internal refresh command IREF to the command receiver/decoder 40 at a predetermined cycle. The command receiver/decoder 40 activates the refresh execution signal MCRFT every time the command receiver/decoder 40 receives the internal refresh command IREF. The oscillator 90 changes the cycle, at which the external refresh command IREF is output, based on the signals THTEMPT and TLTEMPT which has been output from the temperature detector circuit 70. The self-refresh state signal SELF which has been output from the command receiver/decoder 40 is also supplied to the refresh number setting circuit 80.

Figure 12:
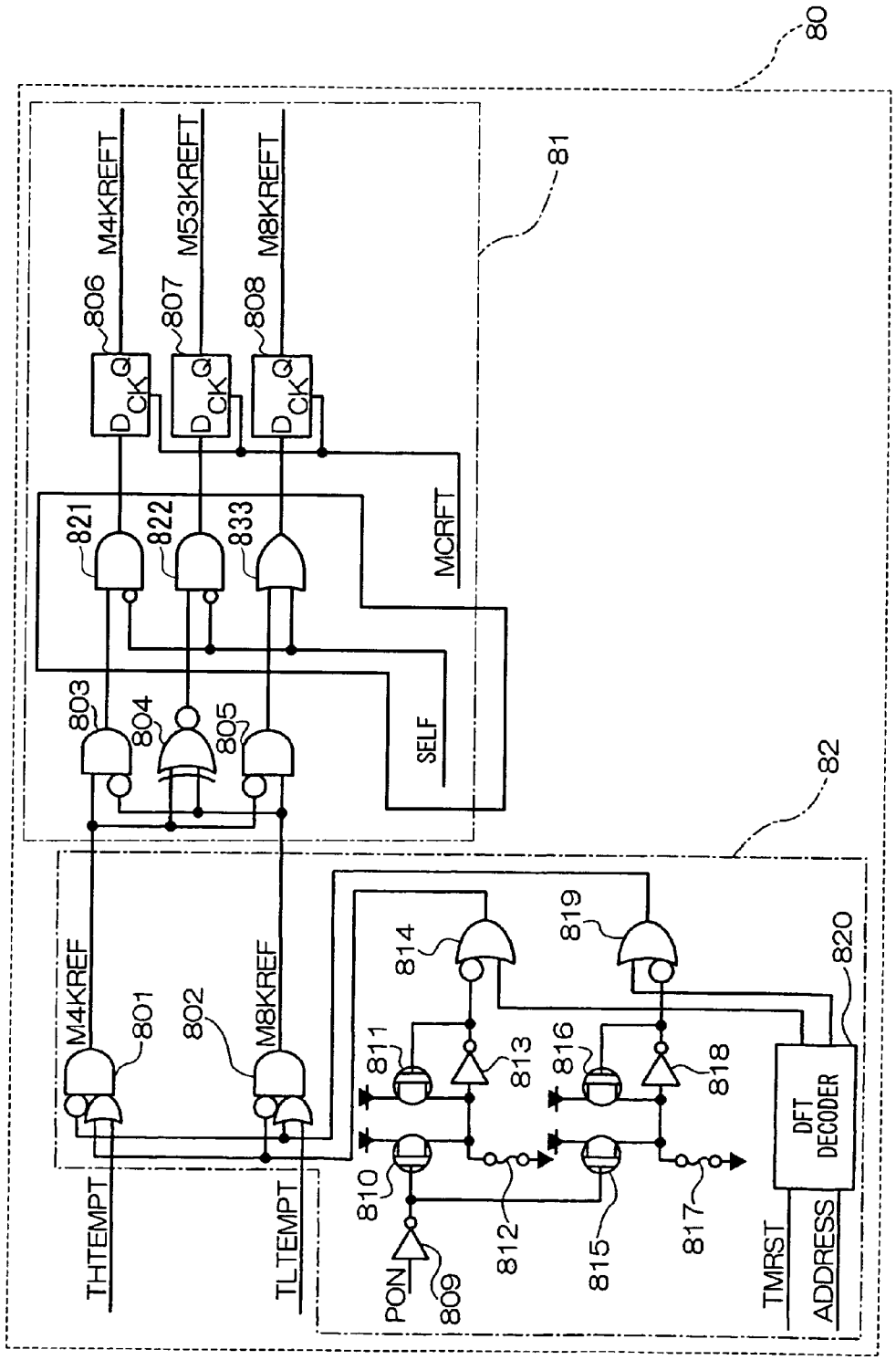
FIG. 12 is a circuit diagram illustrating the configuration of a refresh number setting circuit included in the semiconductor device of FIG. 11.

FIG. 12 is a circuit diagram illustrating the configuration of the refresh number setting circuit included in the semiconductor device of FIG. 11. The refresh number setting circuit 80 of FIG. 12 is different from the refresh number setting circuit 80 of FIG. 5 in having logic circuits 821, 822 and 823. In FIG. 12, when the self-refresh state signal SELF is active and in the "H" level, the signals M53KREFT and M4KREFT are in the "L" level. The semiconductor device 1 of FIGS. 11 and 12 is configured to perform the self-refresh operations in the M8KREFT method. When the self-refresh state signal SELF is inactive and in the "L" level, logic levels of the output signals from the logic circuits 821, 822 and 823 are the same as the logic levels of the output signals from the corresponding logic circuits 803, 804 and 805, respectively. Namely, when the self-refresh state signal SELF is inactive and in the "L" level, the above-described auto-refresh operation is performed.

FIG. 12 illustrates the refresh operations in accordance with the M8KREFT method. The method of the refresh operations should not be limited to this M8KREFT method. Other methods such as the M4KREFT and M53KREFT methods may be available to perform the refresh operations, even it is necessary to modify the configurations of the logic circuits 821, 822, and 823.

When executing the auto-refresh operation, the semiconductor memory device 1 adjusts or changes the number of refresh operations executed in response to a single auto-refresh command which is input from outside, in order to reduce the current consumption. The adjustment or change in the number of refresh operations is made based depending upon a temperature variation of the semiconductor device 1.

When executing the self-refresh operation, the semiconductor memory device 1 adjusts or change an adjustable cycle time, based on the temperature variation of the semiconductor device 1, to reduce the current consumption. An internal refresh command is generated in response to an external refresh-command at the adjustable cycle time. The semiconductor memory device 1 fixes the number of self-refresh operations to be executed in response to a single internal refresh command. The number of self-refresh operations to be executed in response to a single internal refresh command is fixed independent from the temperature variation of the semiconductor device 1.

As described above, the semiconductor memory device according to the invention is a semiconductor memory device in which a memory device divided into plural memory banks is disposed in a part of the semiconductor device and which selects one of the auto-refresh mode and the self refresh mode to refresh the memory device. Here, the number of refresh processes to be performed is selected depending on the temperature of the semiconductor device whenever a command for selecting the auto-refresh mode is detected. According to this configuration, by switching the operation mode of the auto-refresh operation depending on the temperature, it is possible to reduce the number of operations in the tRFC at a low temperature, thereby reducing the current consumption. At a high temperature, it is possible to enhance the number of operations in the tRFC, thereby preventing the loss of data. As a result, it is possible to optimize the auto-refresh operation depending on the operation state of the system.

The semiconductor memory device according to the invention includes the temperature detector circuit being formed in a part of the semiconductor device and detecting the temperature of the semiconductor device, the command receiver/decoder receiving and decoding an external command and outputting the refresh signal MCRFT when the decoding result is the auto-refresh command, the refresh start signal generator circuit outputting the refresh start signal RREFT by a predetermined number of times on the basis of the temperature detection result in response to the refresh signal MCRFT, the bank address counter counting the bank address for selecting a specific memory bank out of the plural memory banks using the number of times determined depending on the temperature as a limit in response to the refresh signal and carrying at the division number of refresh operations on the memory banks, and the X address counter counting up the X address for selecting a word line in the memory bank with the carry. According to this configuration, the number of refresh operations can be selected on the basis of the temperature detection result whenever the auto-refresh command is input. Accordingly, it is possible to optimize the operation state with a good response to the variation in temperature.

Since the temperature detector circuit detects the temperature using plural power source circuits having different temperature characteristics and formed in a part of the semiconductor device, it is possible to smoothly manage the characteristics or the precision of the circuit elements, compared with the case where a circuit detecting the temperature using a single power source circuit is provided.

Since the refresh number setting circuit outputting the signal indicating the number of output refresh start signals RREFT to the refresh start signal generator circuit while retaining the output state every input of the refresh signal MCRFT on the basis of the output of the temperature detector circuit is provided, it is possible to stabilize the signal indicating the number of output refresh start signals RREFT and thus to easily prevent unstable operation at the time of switching the refresh operation.

Since the refresh control circuit controlling the refresh operation on the memory bank selected by the bank address input from the bank address counter in response to the input of the refresh start signal RREFT and the X address selector/buffer circuit selecting the X address input from the X address counter and outputting the selected X address to the plural memory banks in response to the input of the refresh start signal RREFT are provided, it is possible to easily and stably perform the counting operation of the X address even at the time of switching the refresh operation.

The semiconductor memory device in the claims corresponds to the semiconductor memory device 1 or 1a. The temperature detector in the claims corresponds to the temperature detector circuit 70. The command decoder in the claims corresponds to the command receiver/decoder 40. The refresh start signal generator circuit in the claims corresponds to the refresh start signal generator circuit 10. The bank address counter in the claims corresponds to the bank address counter 21. The X address counter in the claims corresponds to the X address counter 22. The refresh number setting unit in the claims corresponds to the refresh number setting circuit 80. The refresh controller in the claims corresponds to the refresh operation control circuit 50. The X address selector in the claims corresponds to the X address selector/buffer circuit 60.

The term "configured" is used to describe a component, section or part of a device includes hardware and/or software that is constructed and/or programmed to carry out the desired function.

It is apparent that the present invention is not limited to the above embodiments, but may be modified and changed without departing from the scope and spirit of the invention.

What is claimed is:

1. A semiconductor device comprising:
    an auto-refresh command detector that detects an auto-refresh command; and
    a refresh number setting unit that sets the number of auto-refresh to be performed in a period of time, based on temperature, when the auto-refresh command detector detects the auto-refresh command.

2. The semiconductor device according to claim 1, further comprising:
    a temperature detector that detects a temperature of the semiconductor device,
    wherein the refresh number setting unit sets the number of refresh based on the temperature detected by the temperature detector.

3. The semiconductor device according to claim 1, further comprising:
    a command decoder that decodes an external command, the command decoder outputting a refresh execution signal if the decoded command is to select auto-refresh; and
    a refresh start signal generator that outputs a predetermined number of refresh start signal based on the refresh execution signal and the detected temperature.

4. The semiconductor device according to claim 3, further comprising:
    a plurality of memory banks;
    a temperature detector that detects a temperature of the semiconductor device; and
    a bank address counter that counts a bank address up to an upper limit based on the refresh execution signal, the upper limit being determined based on the detected temperature, the bank address specifying a memory bank in the plurality of memory banks, the bank address counter carrying a counting number at a division number, the division number being the number of time-division by which refresh is performed to the plurality of memory banks.

5. The semiconductor device according to claim 4, further comprising:
    an address counter that counts up an address when carrying the counting number, the address selecting a word line of the plurality of memory banks.

6. The semiconductor device according to claim 4, wherein the temperature detector detects the temperature by using a plurality of power units having different temperature characteristics.

7. The semiconductor device according to claim 4, wherein the refresh number setting unit supplies a signal to the refresh start signal generator, the signal designating the number of outputs of the refresh start signal, the refresh number setting unit supplies the signal, based on the temperature detected by the temperature detector, in response to each occurrence of the refresh execution signal.

8. The semiconductor device according to claim 7, further comprising:
    a refresh controller that controls refresh operations of a selected memory bank of the plurality of memory banks, the selected memory bank being selected by the bank address supplied from the bank address counter, the refresh controller controlling the refresh operations in response to an input of the refresh start signal; and
    an address selector that selects an address supplied from the address counter, in response to the input of the refresh start signal, the address selector supplying the address to the plurality of bank addresses.

9. A device comprising:
a command decoder configured to generate a refresh execution signal in response to each occurrence of an auto-refresh command;
a refresh start signal generator configured to generate a refresh start signal a variable number of times in response to each occurrence of the refresh execution signal;
a refresh number setting unit configured to designate the variable number in response to a temperature of the device;
a memory cell array; and
a refresh control circuit configured to perform a refresh operation on the memory cell array in response to each occurrence of the refresh start signal.

10. The device according to claim 9, further comprising a temperature detector configured to detect the temperature of the device,
wherein the refresh number setting unit is configured to change the variable number in response to a variation of the temperature of the device.

11. The device according to claim 10, wherein the temperature detector includes a plurality of power units that represent different temperature characteristics from each other.

12. A device comprising:
a command decoder configured to generate a refresh execution signal in response to each occurrence of an auto-refresh command;
a refresh start signal generator configured to generate a first number of refresh start signals in response to each occurrence of the refresh execution signal when the device is at a first temperature and generate in succession a second number of the refresh start signals in response to each occurrence of the refresh execution signal when the device is at a second temperature different from the first temperature, the first number of the refresh start signals being different from the second number of the refresh start signals;
a memory cell array; and
a refresh control circuit configured to perform a refresh operation on the memory cell array in response to each occurrence of the refresh start signals.

13. The device as claimed in claim 12, wherein an interval between one of the first number of refresh start signals and another one of the first number of refresh start signals that succeeds the one of the first number of refresh start signals is substantially equal to an interval between one of the second number of refresh start signals and another one of the second number of refresh start signals that succeeds the one of the second number of refresh start signals.

14. The device as claimed in claim 12, further comprising a refresh number setting unit configured to supply, in a first condition, the refresh start signal generator with a first signal that designates generation of the first number of refresh start signals and to supply, in a second condition, the refresh start signal generator with a second signal that designates generation of the second number of refresh start signals.

15. The device as claimed in claim 14, further comprising a temperature detection circuit detecting the temperature of the device and supplying a result of the detection to the refresh number setting unit.

16. The device according to claim 15, wherein the temperature detector includes a plurality of power units that represent different temperature characteristics from each other.

17. The device as claimed in claim 12, wherein the first temperature is greater than the second temperature and the first number is greater than the second number.

18. The device as claimed in claim 12, wherein the command decoder is configured to activate a self-refresh state signal in response to each occurrence of a self-refresh command, and the device further comprises an oscillation circuit activated in response to the activation of the self-refresh state signal and producing, when activated, cyclically an internal refresh command, and
wherein the command decoder is configured to generate the refresh execution signal in response to each occurrence of the internal refresh command and the refresh start signal generator is configured to generate in succession a third number of refresh start signals in response to each occurrence of the refresh execution signal in a third condition that the self-refresh state signal is being activated.

19. The device as claimed in claim 18, further comprising:
a temperature detection circuit detecting a temperature of the device, and
a cycle adjusting circuit changing a cycle of generation of the internal refresh command by the oscillation circuit in response to the temperature of the device.

20. The device as claimed in claim 18, wherein the first number is substantially equal to the third number.

* * * * *